United States Patent
Mukherjee et al.

(10) Patent No.: US 8,161,422 B2
(45) Date of Patent: Apr. 17, 2012

(54) FAST AND ACCURATE METHOD TO SIMULATE INTERMEDIATE RANGE FLARE EFFECTS

(75) Inventors: Maharaj Mukherjee, Wappingers Falls, NY (US); James A. Culp, Newburgh, NY (US); Scott M. Mansfield, Hopewell Junction, NY (US); Kafai Lai, Poughkeepsie, NY (US); Alan E. Rosenbluth, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 489 days.

(21) Appl. No.: 12/349,108

(22) Filed: Jan. 6, 2009

(65) Prior Publication Data

US 2010/0175043 A1 Jul. 8, 2010

(51) Int. Cl.
*G06F 17/50* (2006.01)
(52) U.S. Cl. ............... 716/53; 716/51; 716/55
(58) Field of Classification Search ........... 716/53
See application file for complete search history.

(56) References Cited

U.S. PATENT DOCUMENTS

| | | | |
|---|---|---|---|
| 6,544,699 B1 | 4/2003 | Kim et al. | |
| 6,753,954 B2 | 6/2004 | Chen | |
| 7,010,776 B2 | 3/2006 | Gallatin et al. | |
| 7,043,712 B2 | 5/2006 | Mukherjee et al. | |
| 7,079,223 B2 | 7/2006 | Rosenbluth et al. | |
| 7,277,165 B2 | 10/2007 | Wu et al. | |
| 7,340,713 B2 | 3/2008 | Beale | |
| 7,422,829 B1 * | 9/2008 | Babcock et al. | 430/5 |
| 2005/0089211 A1 | 4/2005 | Gallatin et al. | |
| 2005/0091013 A1 | 4/2005 | Gallatin et al. | |
| 2005/0091014 A1 | 4/2005 | Gallatin et al. | |
| 2005/0257187 A1 * | 11/2005 | Gallatin et al. | 716/21 |
| 2006/0041851 A1 * | 2/2006 | Gallatin et al. | 716/4 |
| 2006/0101370 A1 | 5/2006 | Cui et al. | |
| 2006/0221322 A1 | 10/2006 | Tinnemans et al. | |
| 2006/0271905 A1 * | 11/2006 | Mukherjee et al. | 716/21 |

OTHER PUBLICATIONS

IBM Technical Disclosure Bulletin—"Region of Interest Caching for Improving the Performance of a Shapes Processing System"—IP.com "IPCOM000016281D"—Original Publication Date Sep. 9, 2002—IP.com Electronic Publication Date Jun. 21, 2003.
IBM Technical Disclosure Bulletin—"Region-of-Interest Edge Iterator for Geometrical Computation"—IP.xom IPCOM000106515D—Original Publication Date Nov. 1, 1993—Priginal Disclosure Information: TDB v36 n11 11-93 p. 401-408.
International Search Report and Written Opinion PCT/US2010/020059.

* cited by examiner

*Primary Examiner* — Paul Dinh
*Assistant Examiner* — Bryce Aisaka
(74) *Attorney, Agent, or Firm* — Catherine Ivers; Ian MacKinnon; Todd M. C. Li

(57) ABSTRACT

A method is provided for modeling lithographic processes in the design of photomasks for the manufacture of semiconductor integrated circuits, and more particularly for simulating intermediate range flare effects. For a region of influence (ROI) from first ROI1 of about 5λ/NA to distance ROI2 when the point spread function has a slope that is slowly varying according to a predetermined criterion, then mask shapes at least within the distance range from ROI1 to ROI2 are smoothed prior to computing the SOCS convolutions. The method provides a fast method for simulating intermediate range flare effects with sufficient accuracy.

18 Claims, 18 Drawing Sheets

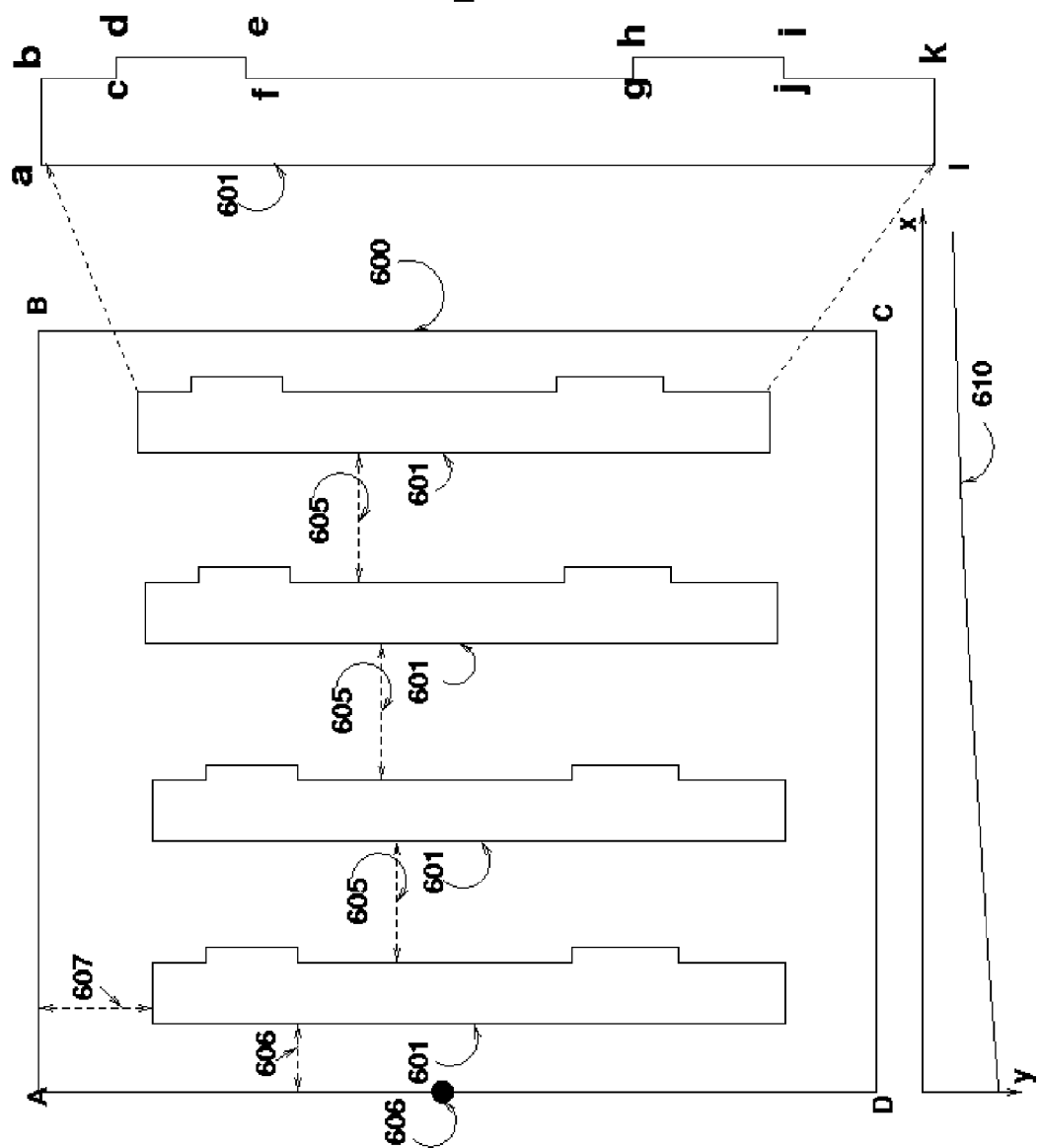

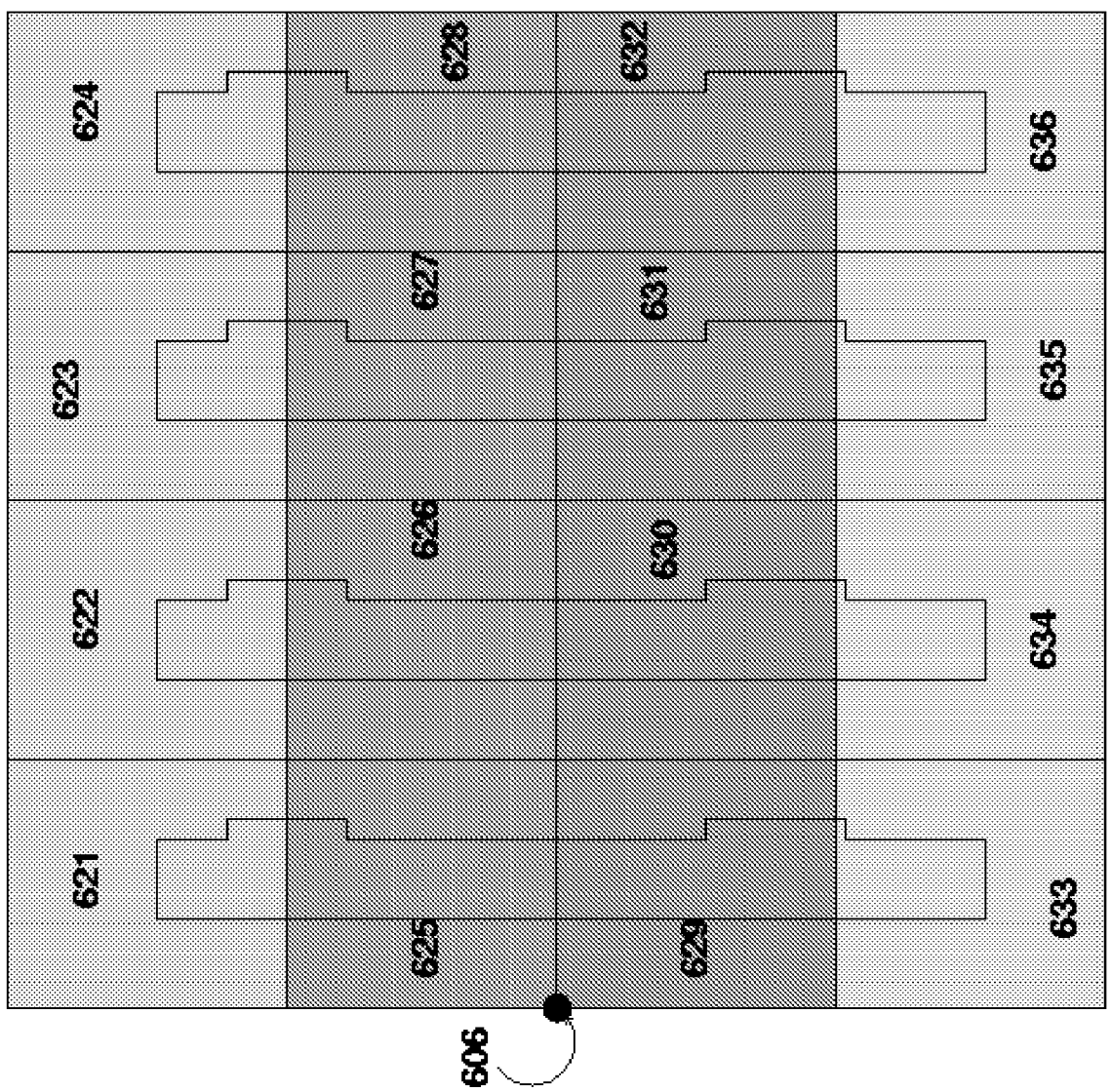

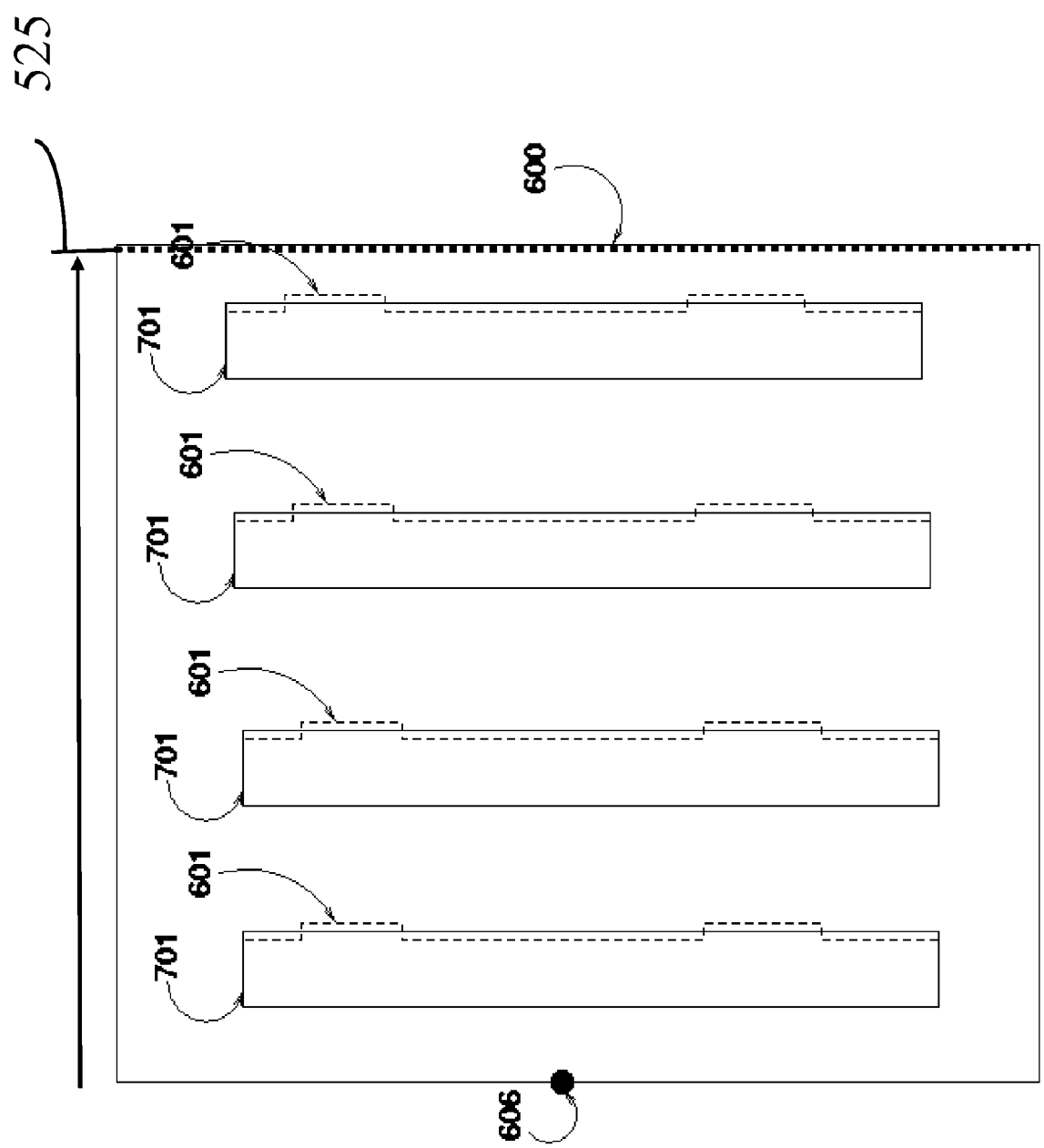

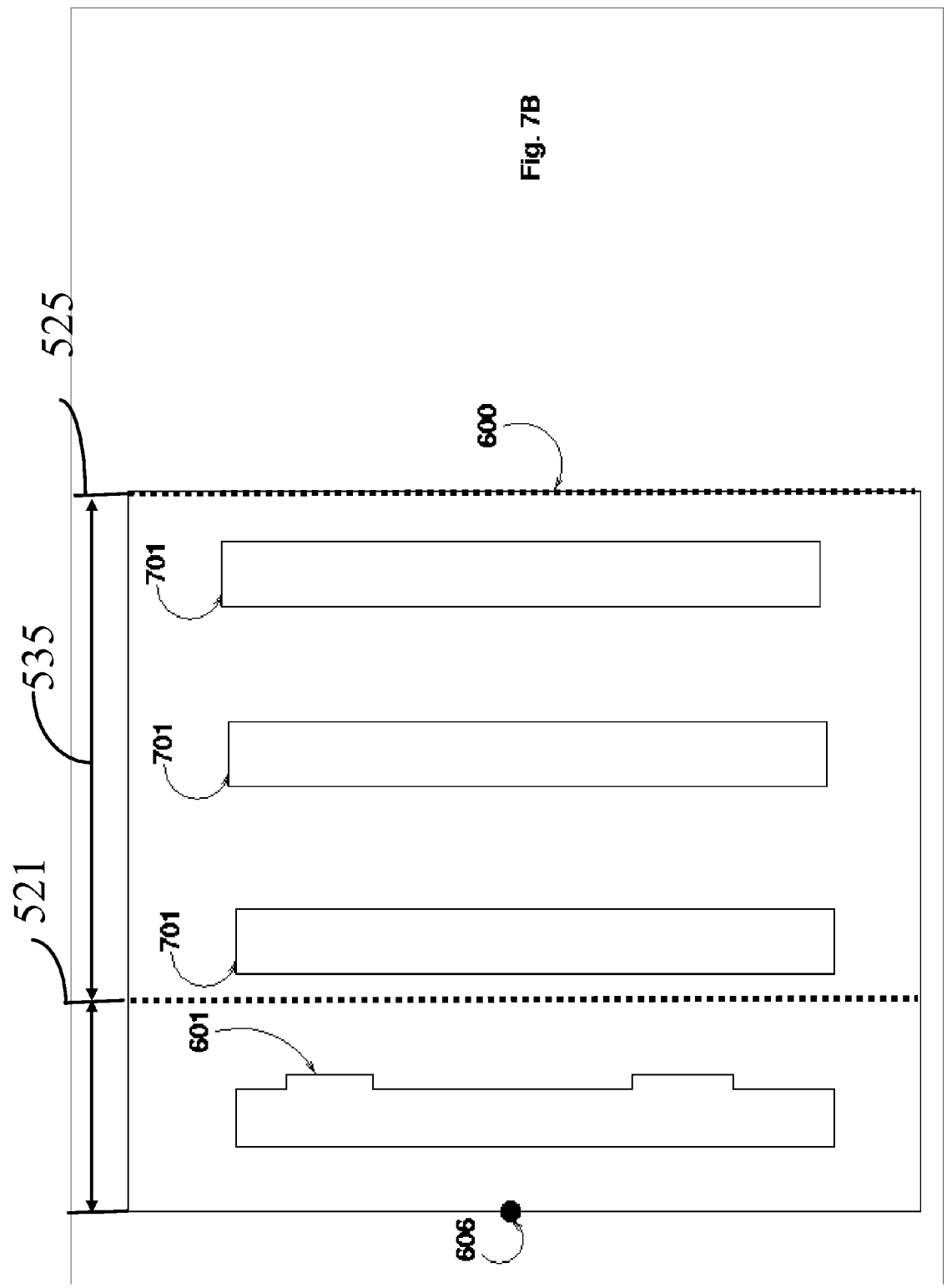

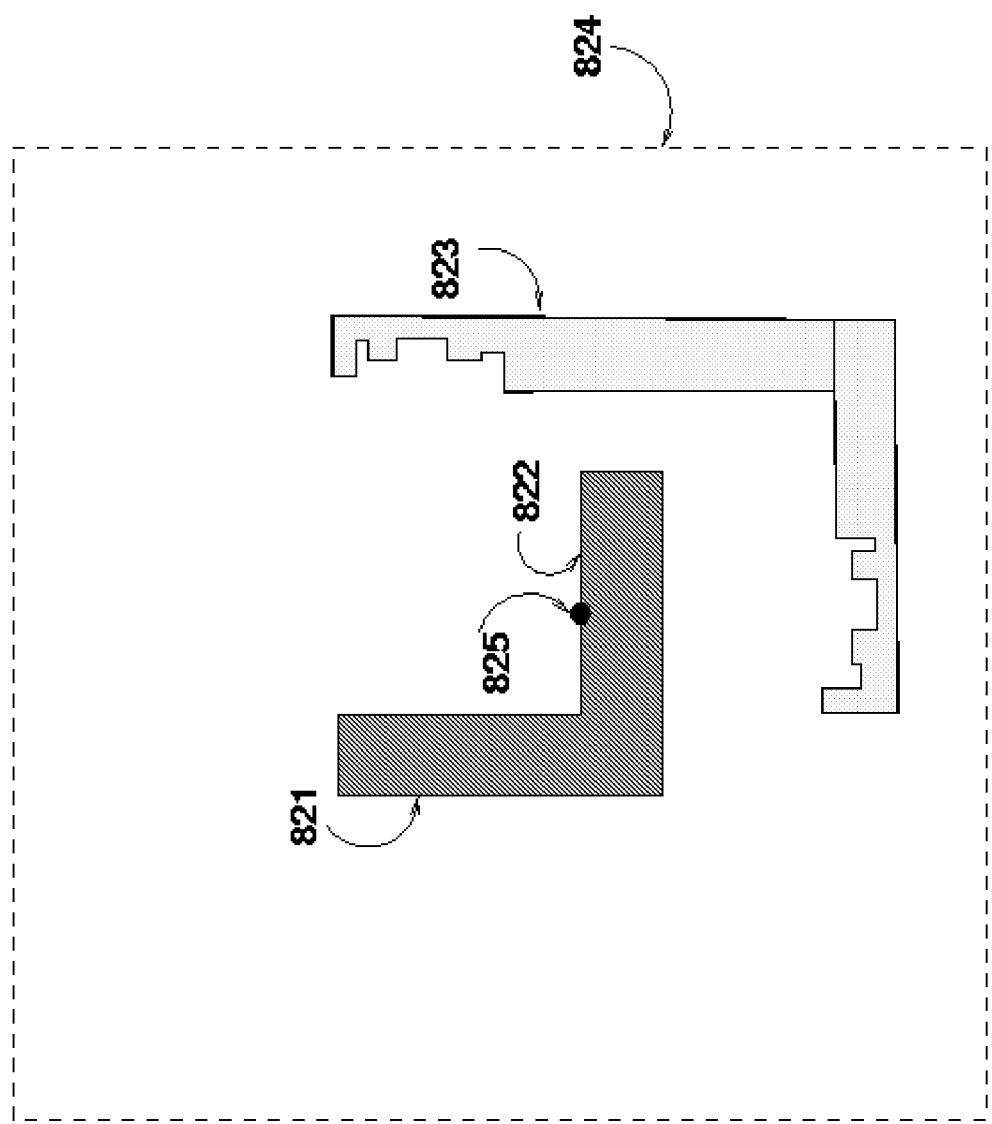

FAST AND ACCURATE METHOD TO SIMULATE INTERMEDIATE RANGE FLARE EFFECTS

TECHNICAL FIELD

This invention relates generally to the field of optical lithography, and more particularly, to a method for incorporating intermediate-range flare effects for use in a model-based optical lithography simulation, to provide a fast and accurate correction of the shapes in a photo-mask or in mask verification during the design of a lithographic mask.

BACKGROUND OF THE INVENTION

In the manufacture of integrated circuits, photolithography, or lithography, is typically used to transfer patterns relating to the layout of an integrated circuit onto a wafer substrate, including, but not limited to, materials such as silicon, silicon germanium (SiGe), silicon-on-insulator (SOI), or various combinations thereof. The drive to improve performance of very-large-scale integrated (VLSI) circuit-s results in increasing requirements to decrease the size of features and increase the density of layouts. This in turn increasingly requires the use of Resolution Enhancement Techniques (RET) to extend the capabilities of optical lithographic processes. RET includes but not limited to techniques such as the use of optical proximity correction (OPC), sub resolution assist feature (SRAF) enhanced lithography and phase-shifted-mask-enhanced lithography (PSM).

In spite of the spectacular advancement of several forms of Resolution Enhancement Techniques (RET), the iterative Model-Based Optical Proximity Correction (MBOPC) methodology has established itself as a method of choice for compensation of the mask shapes for lithographic process effects during the process of designing such masks. Conventional MBOPC tools work include the following steps in a manner similar to the following. The shapes on the mask design (henceforth referred to as the mask) are typically defined as polygons. A pre-processing step is performed that divides the edges of each mask shape into smaller line segments. At the heart of the MBOPC tool is a simulator that simulates the image intensity at a particular point, which is typically at the center of each of the line segments. The segments are then moved back and forth, i.e., outward or inward from the feature interior, from their original position on the mask shape at each iteration-step of the MBOPC. The iteration stops when (as a result of the modification of the mask shapes) the image intensity at these pre-selected points matches a threshold intensity level, within a tolerance limit.

The aforementioned methodology is illustrated in FIG. 1. In the current state of the art, an input mask layout 101 and a target image 106 are provided. The mask shapes are divided into segments 102, where each segment is provided with a self-contained evaluation point (103). The optical and the resist image are then evaluated at evaluation points 104. In step 105, the images at each of the evaluation points are then checked against the tolerance of the target image 106. If the image does not remain within tolerance the segment is iteratively moved forward or backward 107 until all segments reside within an accepted tolerance. Eventually, the final corrected mask layout is outputted 108.

Modeling aerial images is a crucial component of semiconductor manufacturing. Since present lithographic tools employ partially coherent illumination, such modeling is computationally intensive for all but the most elementary patterns. The aerial image generated by the mask, i.e., the light intensity of an optical projection system image plane, is a critically important parameter in micro-lithography for governing how well a developed photo-resist structure replicates a mask design and which, generally, needs to be computed to an accuracy of better than 1%. Such image models are used not only in mask correction (e.g. optical proximity correction methodologies) but also in other applications, such as mask verification methodologies. Mask verification is performed on a final mask design, after modification for example by optical proximity correction, to ensure that the final image will meet specified tolerances and not exhibit any catastrophic conditions such as opens, shorts, and the like.

In an Aerial Image simulator, in addition to the diffraction of light in the presence of low order aberrations, the scattered light which affects the exposure over long distances on the wafer are recently being considered. Such long-range optical effects are generally referred to as "flare" in the literature. Flare affects the current extremely tight requirements on Across-Chip-Line-Width-Variation (ACLV). The flare effects are more pronounced in some novel RET methods requiring dual exposure such as alternating Phase Shifting Masks (Alt-PSM) or Double Di-Pole methodologies. The problem is even more pronounced in bright field masks that are used in printing critical levels which control the ultimate performance of the circuit, such as gate and diffusion levels.

One significant difficulty when taking into consideration long range effects, such as flare, is the extent of the corrections flare effects required on the mask. The diffraction effects and corresponding optical lens aberrations that are modeled by the 37 lowest order Zernikes that dies off within a range of a few microns. The flare effect, on the other hand, extends up to a few mms, thus covering the entire chip area.

Flare is generally considered to be the undesired image component generated by high frequency phase "ripples" in the wavefront corresponding to the optical process. Flare thus arises when light is forward scattered by appreciable angles due to phase irregularities in the lens. (An additional component of flare arises from a two-fold process of backscatter followed by re-scatter in the forward direction, as will be discussed hereinafter). High frequency wavefront irregularities are often neglected for three reasons. First, the wavefront data is sometimes taken with a low-resolution interferometer. Moreover, it may be reconstructed using an algorithm of an even lower resolution. Second, even when the power spectrum of the wavefront is known or inferred, it is not possible to include the effect of high frequency wavefront components on an image integral that is truncated at a short ROI distance, causing most of the scattered light to be neglected. Finally, it is not straightforward to include these terms in the calculated image. The present invention addresses these problems.

It is generally observed that the flare energy $F(\vec{r})$ from a wavefront ripple follows approximately the inverse power law relationship of the form given by: $F(\vec{r}) = K/(\vec{r} - \vec{r}')^\gamma$, where $\vec{r}$ is the location of the point of interest influenced by the flare energy, $\vec{r}'$ is the location of the source of flare, K is a constant to be fitted and the exponent $\gamma$ is referred to as the flare kernel parameter and is determined experimentally. Flare energy is proportional to 1/dose. An example of a plot of flare observed experimental data points 201 is shown in FIG. 2A. FIG. 2A is a dimensionless plot of flare energy as a function of distance from the source of light for a typical optical process of a numerical aperture (NA) of 0.75 and a pupil size ($\sigma$) of 0.3. The curve 202 fitted to the data points 201 yields a value for $\gamma$ of 1.85.

In order to compute the impact of the flare on the image intensity at a point the flare kernel is convolved or integrated with the mask shapes. The convolved contribution of the mask shapes are summed up to get the image intensity at a point. This step is shown in FIG. 2B.

FIG. 2B is a simplified flowchart illustration of a method of simulating or recreating an output wafer image as is known in the art using the flare kernel described above. As is known in the art, method 200 provides a mask layout 201 and a set of flare parameters 202 as inputs. Parameters 202 may include for example the flare kernel parameter $\gamma$, the wavelength $\lambda$ of the light used, source parameters such as inner and outer radius $\sigma1$ and $\sigma2$ of the source pupil, numerical aperture NA, and Zernike parameters Z1, Z2, . . . , Zn that define the lens aberrations of the optical system.

In order to simulate optical image intensity at a point 251, method 200 considers at step 203 an flare interaction region, or region of influence ROI, 252 surrounding the simulation point 251. Interaction region 252 may typically be a square or circular area having dimensions of typically in the range 5-20 microns across that encloses all shapes that will have a significant optical influence on the image intensity at the simulation point 251. As is known in the art, the size of the interaction region 252 is normally determined by the tradeoff between computational-speed versus desired accuracy. The image computation may typically proceed by computing the coherent kernels (Block 204), which are convolved with each of the mask functions (Block 205), and the convolutions are summed (Block 206) to obtain the simulated image on the wafer plane (Block 207).

Since the effect of flare diminishes slowly but steadily across the chip, some prior arts make certain trade offs in computing the convolution process. The most accurate of the computation is the convolution with the actual geometry of the mask shapes. However, this methodology is very slow. On the other hand the impact of flare diminishes considerably beyond 10-15 microns. Beyond this range the geometric details of the mask shapes can be approximated by a density map or a pixelated image of the geometric shapes. In the closer range (less than 1-2 microns), however, it is important to use the exact polygonal shapes for the accuracy of the image computation. Since exact polygonal shapes are used in any case for computing the diffraction limited part of the aerial image for this range of 1-3 microns, short range computation of the flare does not add to any significant runtime penalty.

Referring to FIG. 3A, a layout 30 is shown for describing pixilated or density map, whereby the layout 30 has thereon a plurality of finite geometrical shapes 31. The cell array layout 30 is divided or partitioned into a plurality of uniform patterns, illustrated as uniform rectangles 34. Other pixel shapes may be used; for example, the cell array layout 30 may be partitioned into any type of polygon pattern that is capable of spanning and covering the whole layout including, but not limited to, regular or irregular, convex or concave, or any combination thereof.

Once the layout 30 is divided into the plurality of uniform squares 34, a density map 40 of the layout may be computed, as shown in FIG. 3B. This is accomplished by initially dividing the layout 30 into each of the plurality of individual squares 34 followed by determining that portion of each square 34 that is covered by any finite geometrical shape(s) 31. Once the amount of coverage of each of the uniform squares 34 has been computed, each square 34 is then assigned a number based upon how much of that square is covered by finite geometrical shape(s) 31. For example, as shown in FIG. 3B the percentage of coverage of each square is illustrated, whereby this percentage represents a density number 45 for each square.

In accordance with the invention, the overall density map may represent numerous different density effects including, but not limited to, geometries of the finite geometrical shapes, the coverage of such geometries (e.g., the percentage of the present model-based hierarchal prime cell level that is covered by finite geometrical shapes versus that portion not covered by such shapes, such as that shown in FIG. 3B), the amount of coverage of the cell array layout 30 portion, area coverage, coverage by the computed aerial, resist or any other form of wafer image, perimeter coverage or any other topological coverage, and even combinations thereof.

After the overall density map 40 of the prime cell level is complete, i.e., once all density numbers 45 for the plurality of squares 34 have been computed, the density map 40 represents qausi-images of the shapes, rather then using exact geometries. Each density 45 operating at each of the plurality of squares 34 are convolved with the inverse power law kernel to obtain a plurality of convolved operating densities across the density map.

The geometric convolution is described with the help of FIGS. 4A, 4B, 4C, 4D. FIG. 4A shows a rectangular shape 400. FIG. 4B shows the same rectangular shape partitioned into 4 sectors, viz. 401, 402, 403 and 404. An example of a sector is shown as 450. Each of these sectors are bounded by one horizontal and one vertical line. Rectangle 400 can be expressed as the follows:

Sector 401−Sector 402−Sector 403+Sector 404. In a geometric convolution each of these sectors are convolved with the flare kernel.

The number of sectors for a shape is linearly proportional to the number of vertices of that shape. This is explained in FIGS. 4C and 4D. FIG. 4C shows a polygon 410 with 10 vertices. FIG. 4D shows the corresponding shape in terms of sectors. Shape 410 can be parsed in terms of sectors as: (Sector 411−Sector 412−Sector 413+Sector 414)+(Sector 415−Sector 416−Sector 417+Sector 418)+(Sector 419−Sector 420−Sector 421+Sector 422).

Therefore, as the number of vertices increases in a shape the geometric convolution becomes more and more computationally expensive since the number of sectors increases.

The differences between the pixel based and geometry based approach are further elaborated using FIGS. 6A and 6B. FIG. 6A shows an exemplary mask 600 with 4 micron×4 micron area with vertices A, B, C and D. The distance between vertices A and B, B and C, C and D, and, D and A are 4 microns. Mask 600 consists of 4 copies of the shape 601 at the shown locations, so that the distance between them is 605. Shape 601 is an ortho-normal shape with edges parallel to the x and the y axes only. In this example 605 has a value of 0.700 micron. The left most shape 601 is placed at a distance of 606 from the edge AD and at a distance 607 from the edge AB, respectively, of mask 600. In this example 606 has a value of 0.350 micron and 607 has a value of 0.500 microns respectively. Shape 601 have 12 vertices, viz., a, b, c, d, e, f, g, h, i, j, k, l. In this particular example, the distances between respective vertices are given as follows: a and b: 0.295 micron, b and c: 0.300 micron, c and d: 0.005 micron, d and e: 0.300 micron, e and f: 0.005 micron, f and g: 2 micron, g and h: 0.005 micron, h and i: 0.300 micron, i and j: 0.005 micron, j and k: 0.300 micron and k and l: 0.295 micron.

The shapes in mask 600 are used to compute the flare intensity at a point 606 at the center of the edge AD of the mask 600. The flare kernel is shown as the curve 610 which is an inverse power-law kernel with the value of $\gamma$=1.5.

Using geometric convolutions as explained above requires that each shape 601 of the mask is represented by 12 sectors. Therefore after 48 convolution computations (for 4 shapes) the value of the flare intensity as computed at point 606 is 0.032692. The above computation is the most accurate computation barring numerical errors.

FIG. 6B shows the effect of pixelization of the mask 600. Mask 600 is pixelized into 16 pixels, viz., 621 through 636. Each pixel size is 1 micron×1 micron. The density values of the pixels are as follows: For pixels 621, 622, 623, 624: 0.2153; For pixels 625, 626, 627, 628: 0.4456; For pixels 629, 630, 631, 632: 0.4785; and For pixels 633, 634, 635, 636: 0.1675. Using the above pixelized representation, the flare intensity at point 606 is computed as 0.029103. This result has a 10% error and uses 16 convolutions. If the pixels are made smaller the error reduces, but the number of convolution computation increases.

There is a region that is in between the short and the long range, for example, between from 2-10 microns. This region is referred to as the "Intermediate Range." It is important to make a very careful speed accuracy trade off for the computation in this region. There are several reasons, why intermediate-range computation of flare is very important. With better optics (high gamma) intermediate range flare dominates the longer range. Accuracy is more important for the intermediate range than the longer range.

There are known methods using the density based approach or a pixelated polygons in the intermediate region for obtaining efficient computation, but that have the disadvantage of diminished accuracy. Yet other methods use exact mask geometries for accuracy at the significant cost of computational efficiency. Intermediate range flare dominates the flare computation both memory and runtime wise more than the short or the long range flares.

Accordingly, it would be desirable to provide a method for computing the convolution of intermediate range flares with mask shapes in a manner that improves the efficiency of lithographic process models for use in MBOPC or mask verification, while not reducing the quality or accuracy of the simulations.

SUMMARY OF THE INVENTION

According to a first aspect, a method is provided for designing a lithographic mask, including the use of a lithographic process model for simulating an image formed by illumination of the lithographic mask in a lithographic system, the method comprising: determining a first region of influence (ROI1) around a point of interest on the mask design, such that mask features within said first ROI1 will contribute a relatively large amount of flare energy at said point of interest; determining a second region of influence (ROI2) around said point of interest, such that mask features outside of said ROI2 will contributed a relatively small amount of flare energy at said point of interest in accordance with a predetermined criterion, such that the region between ROI1 and ROI2 comprises an intermediate region of influence (intermediate ROI); identifying an initial mask polygon shape having a first plurality of vertices located within the intermediate ROI; and smoothing said initial mask polygon shape to form a smoothed mask polygon shape that has fewer vertices within the intermediate ROI than said first plurality of vertices; determining a smoothed flare contribution at said point of interest from said vertices of said smoothed mask polygon within the intermediate ROI; and determining an image at the point of interest comprising using said smoothed flare contribution in the lithographic process model rather than a flare contribution from said initial mask polygon shape.

According to another aspect of the invention, the ROI1 has an outer boundary at a distance of about 5λ/NA around the point of interest, where λ is the wavelength of the illumination energy and NA is the numerical aperture of the lithographic system.

According to yet another aspect of the invention, the predetermined criterion comprises a slope cutoff for determining when a slope of the point spread function of the lithographic system is close to zero.

According to a further aspect of the invention, the point spread function $h/(\vec{r} - \vec{r}_{Avg})$ is a function of distance $\vec{r} - \vec{r}_{Avg}$ from the point of interest $\vec{r}$, and the point spread function has the form $h \propto K/(\vec{r} - \vec{r} -)^{\gamma}$, where K and γ are experimentally determined, and wherein the slope of the point spread function is given by $$\frac{\partial h(\vec{r} - \vec{r}_{Avg})}{\partial \vec{r}}.$$

According to yet another aspect of the invention, the intermediate ROI is further divided into a plurality of sub-intermediate ROIs, and wherein a different amount of smoothing is performed in at least one of said plurality of sub-intermediate ROIs than in another of said plurality of sub-intermediate ROIs. The amount of smoothing in a sub-intermediate ROI preferably depends on the proximity of said sub-intermediate ROI to said point of interest.

According to another aspect of the invention, smoothing is performed by a sequential grow and shrink operation or a low-pass filtering in the spatial frequency domain.

According to another aspect of the invention, the step of determining an image at the point of interest comprises determining a flare contribution from within said first ROI1 using mask features within said first ROI1 that are not smoothed.

According to another aspect of the invention, the step of determining an image at the point of interest comprises determining a flare contribution from mask features located beyond said second ROI2 using a density mapping approach.

According to yet another aspect of the invention, the resulting image may be provided for use in an optical proximity correction methodology or in a mask verification methodology.

BRIEF DESCRIPTION OF THE DRAWINGS

These and other features, aspects, and advantages will be more readily apparent and better understood from the following detailed description of the invention, with reference to the following figures wherein like designations denote like elements, which are not necessarily drawn to scale.

FIG. 6A illustrates mask shapes having segments and vertices used in a geometric convolution approach for simulating an image.

FIG. 6B illustrates density values assigned to pixels representing mask shapes in a pixelization approach for simulating an image.

FIGS. 7A-7B illustrate smoothed shapes used in flare computations in accordance with the invention.

FIGS. 8A-8E illustrate embodiments of regions of influence (ROIs) around an evaluation point or point of interest in a mask layout, in accordance with the invention.

DETAILED DESCRIPTION

Figure 1:
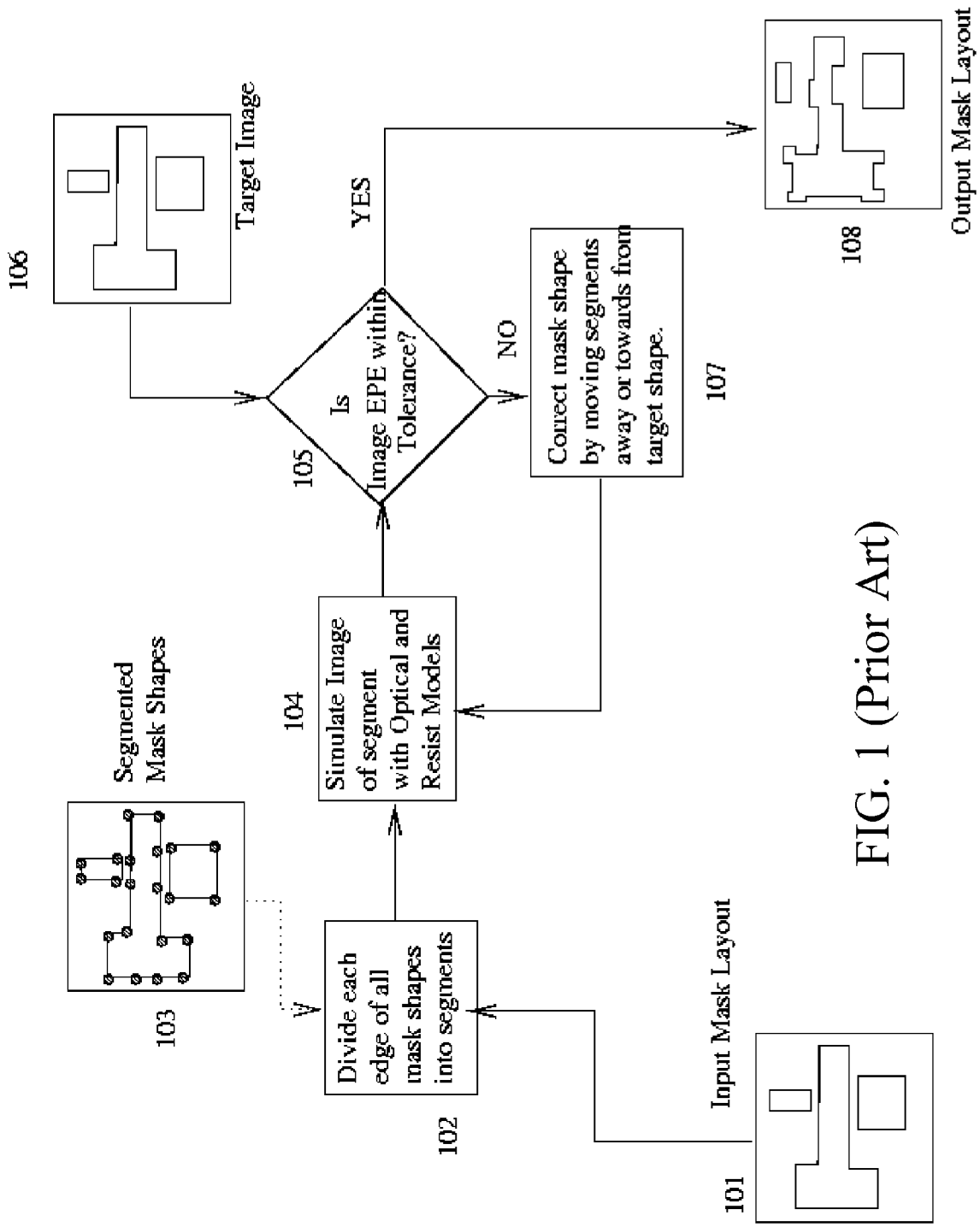
FIG. 1 illustrates an exemplary method for performing optical proximity correction.
Figure 2A:
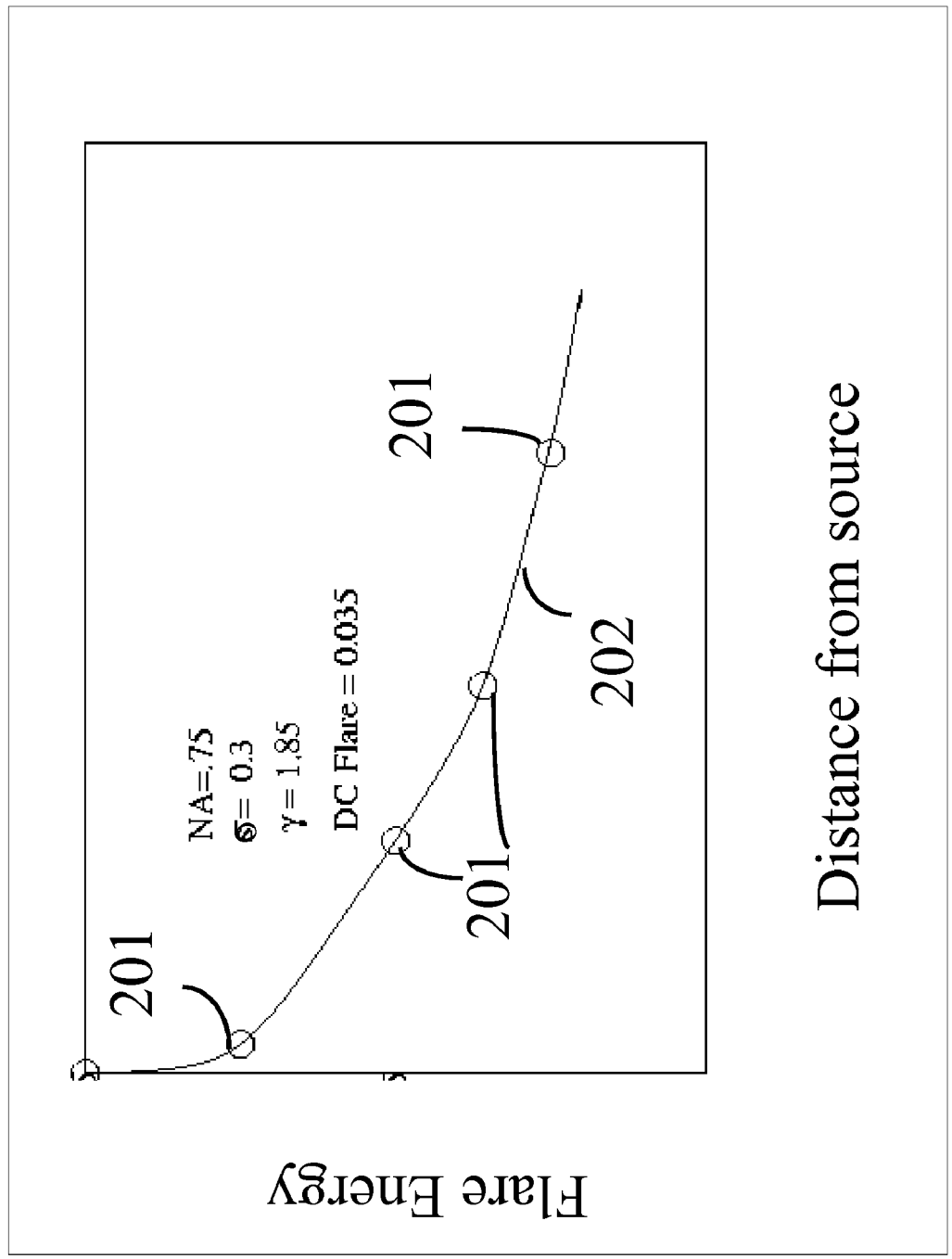
FIG. 2A illustrates a plot of observed flare as a function of distance from the source of light.
Figure 2B:
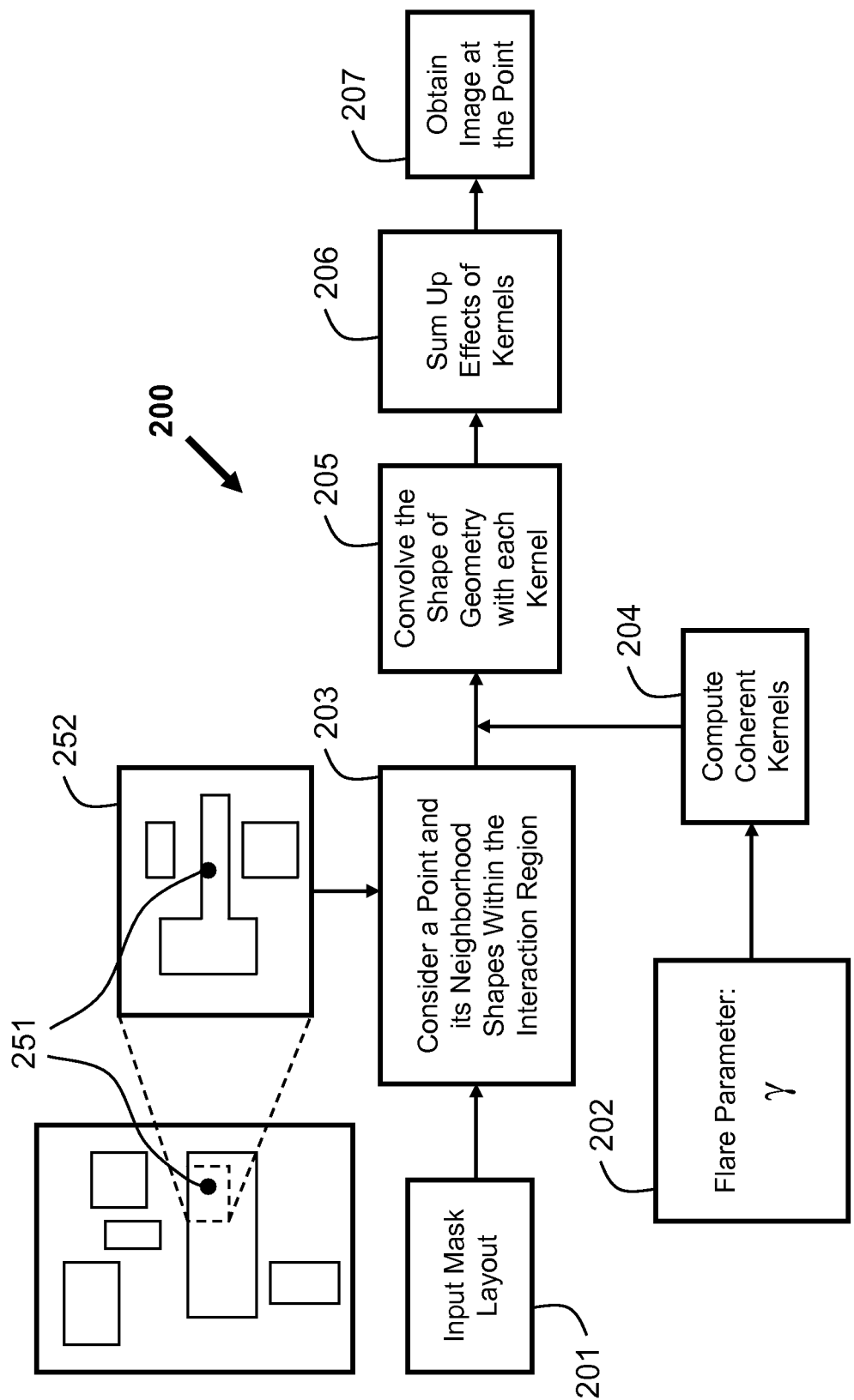
FIG. 2B illustrates an exemplary method for simulating an image including flare.
Figure 3A:
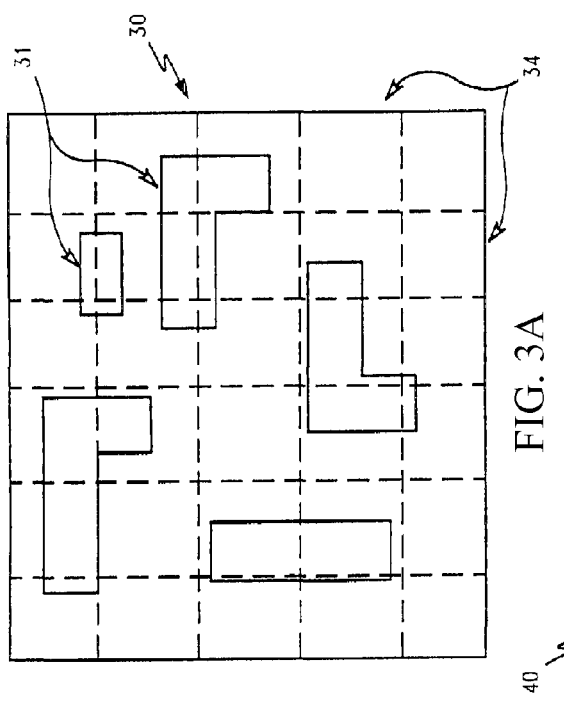
FIG. 3A illustrates a mask layout partitioned for simulating an image using a pixilated or density mapping approach.
Figure 3B:
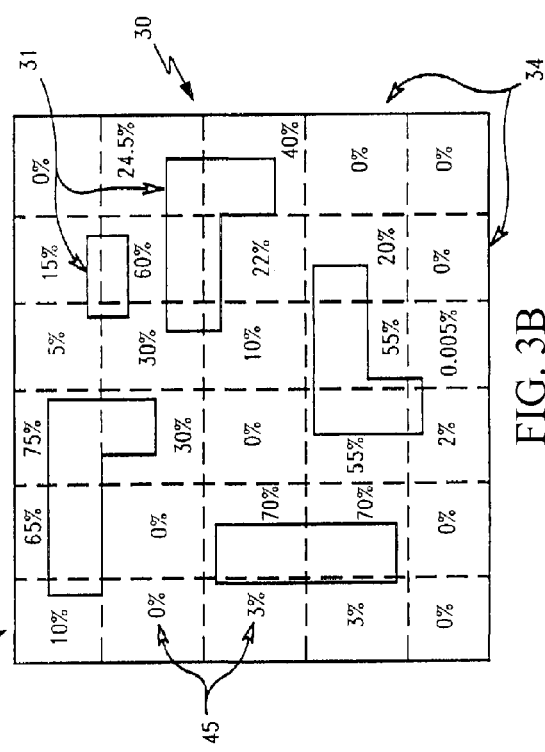
FIG. 3B illustrates an assignment of density mapping values for the mask layout illustrated in FIG. 3A.
Figure 4A:
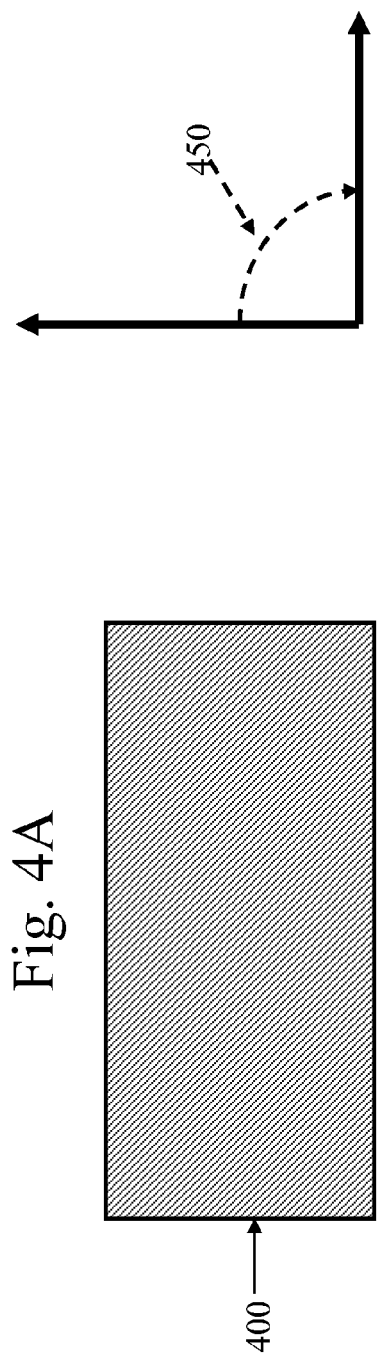
FIGS. 4A-4D illustrate partitioning of mask shapes for use in a geometric convolution approach for simulating an image.
Figure 4B:
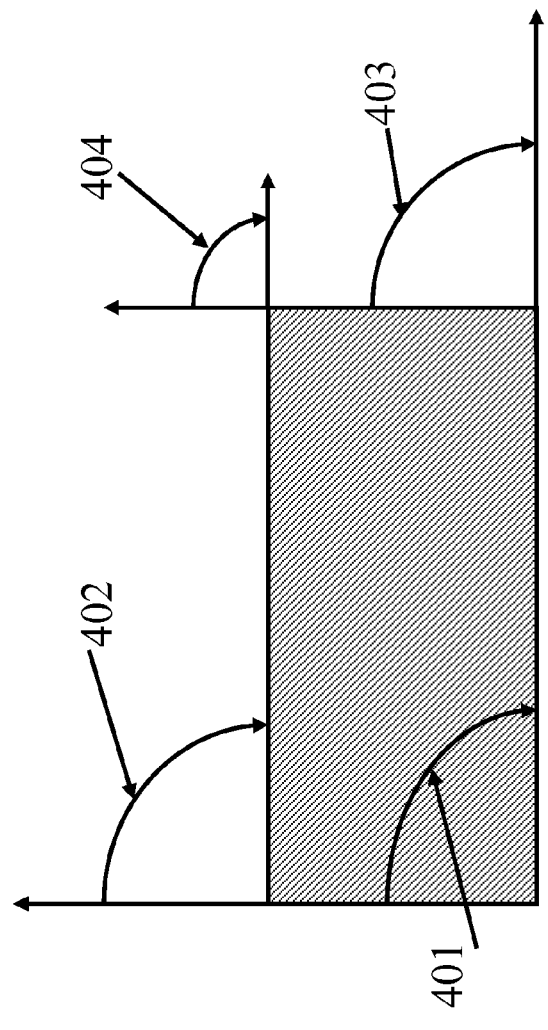
Figure 4C:
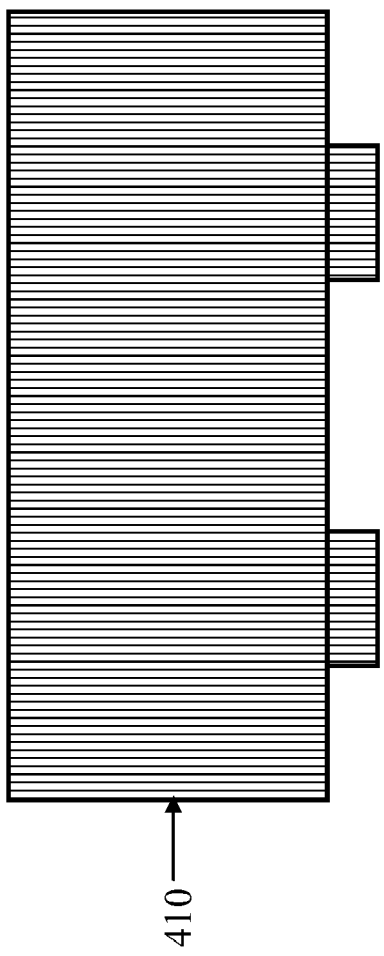
Figure 4D:
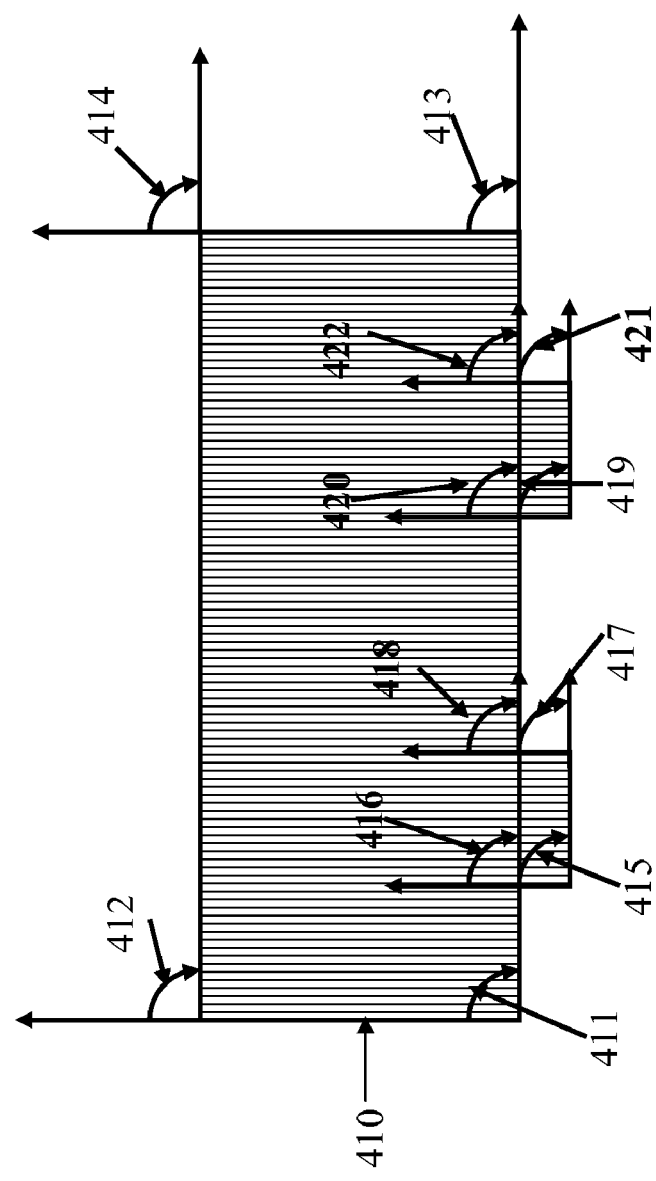

An objective of the embodiments of the invention described herein is to provide a method and system by which evaluation of flare, particularly in the intermediate distance range, is done efficiently and accurately in a lithographic process model or simulator used in a designing a mask, for example, to perform optical proximity correction (OPC) or mask verification. Thus, according to embodiments of the invention, unnecessary variations are removed from the neighboring mask shapes that influence the computation of convolution of the flare in an intermediate distance ranging from a first ROI (ROI1), preferably having a radius of about 5λ/NA around the point of interest where the image is to be simulated, to a second region of influence ROI2 around the point of interest, determined according to a predetermined small flare influence criteria, beyond which the effect of flare would be sufficiently small so that a density mapping approach provides sufficient accuracy. As described with reference to FIG. 2D, a density mapping approach represents the influence on the point of interest expressed as an average weighting of shapes within a pixel. In a preferred embodiment, the predetermined small flare criterion is where the ROI2 has an outer boundary whose distance from the point of interest is such that the slope of the point spread function of the optical system is equal to or less than a slope cutoff close to zero. The slope cutoff is the predetermined small flare criterion in this embodiment.

In accordance with the invention, smoothed versions of shapes are used corresponding to mask shapes that are in the range of intermediate flare influence between the region of high flare influence ROI1 and a second region of small flare influence ROI2, as determined by a small flare influence criterion. The overall efficiency of flare calculations overall is preferably obtained by combining a rigorous flare calculation for shapes in the distance range less than a first radius of high flare influence for the ROI1 (i.e. less than about 5λ/NA), the intermediate flare calculations using smoothed shapes in the intermediate range from ROI1 to ROI2 in accordance with the invention, and a density mapped computation of flare influence for shapes at distances greater than the outer boundary of ROI2. The ROI, according to the invention, is not limited to having a radial distance from the point of interest, but is also intended to encompass any distance from the point of interest that may be used to indicate the range of influence, such as a horizontal or vertical distance from the point of interest in a cartesian coordinate system.

The advantage of the present invention is that it will reduce the number of unnecessary sectors for mask shapes in the intermediate flare range, which would improve the efficiency of the MBOPC iterations over the prior art. The reduced number of sectors in the intermediate range will also improve memory utilization of the MBOPC and also result in improved hierarchical handling for the OPC. Accuracy in the short range of high influence less than ROI1 of about 5λ/NA may be maintained with a rigorous calculation using the original unsmoothed shapes. Additional efficiency may be obtained by using a density mapped representation of the shapes for distances greater than ROI2.

The image intensity at a point on the wafer is modeled by the Hopkin's Equation described below in Equation (1).

$$I_0(\vec{r}) = \iiiint d\vec{r}'\, d\vec{r}''\, h(\vec{r}-\vec{r}')h^*(\vec{r}-\vec{r}'')j(\vec{r}''-\vec{r}''')m(\vec{r}')m^*(\vec{r}''), \quad (1)$$

where h is the lens point spread function of the optical system or kernel;

j is the partial coherence of the optical wave;

m is the mask amplitude function; and $\vec{r}'$ and $\vec{r}''$ are dummy distance variables in the optical coordinate system from the point of interest $\vec{r}$.

The above Equation (1) expression for intensity $I(\vec{r})$ at the point of interest $\vec{r}$ can be approximated by the Sum of Coherent Systems (SOCS) as:

$$I(\vec{r}) \cong \sum_{i=1}^{N} \left| \int_{ROI} d^2\vec{r}_{Avg}\, \tilde{h}_i(\vec{r}-\vec{r}_{Avg})m(\vec{r}_{Avg}) \right|^2 \iint_{outsideROI} \iint d\vec{r}'\, d\vec{r}''\, h(\vec{r}-\vec{r}')h^*(\vec{r}-\vec{r}'')j(\vec{r}'-\vec{r}'')m(\vec{r}')m^*(\vec{r}'') \quad (2)$$

where $$\vec{r}_{Avg} = \frac{\vec{r}' + \vec{r}''}{2},$$

and ROI is the region of interaction or influence.

Defining $\vec{\Delta} = \vec{r}'' - \vec{r}'$ and $\tilde{\vec{r}} = \vec{r} - \vec{r}_{Avg}$, at large values of $\tilde{\vec{r}}$, use the following approximation:

$$h\left(\tilde{\vec{r}} - \frac{\vec{\Delta}}{2}\right)h^*\left(\tilde{\vec{r}} + \frac{\vec{\Delta}}{2}\right) \cong |h(\tilde{\vec{r}})|^2. \quad (3)$$

Equation (2) can be further approximated as:

$$I(\vec{r}) \cong \sum_{i=1}^{N} \left| \int_{ROI} d^2\vec{r}_{Avg}\, \tilde{h}_i(\vec{r}-\vec{r}_{Avg})m(\vec{r}_{Avg}) \right|^2 + \iint_{outside\,ROI} d^2\vec{r}_{Avg} \quad (4)$$

-continued $$|h(\vec{r} - \vec{r}_{Avg})|^2 \left[ \int\int_{\substack{outside \\ ROI}} d^2\vec{\Delta} j(\vec{\Delta}) m\left(\vec{r}_{Avg} - \frac{\vec{\Delta}}{2}\right) m^*\left(\vec{r}_{Avg} + \frac{\vec{\Delta}}{2}\right) \right]$$

where $\tilde{h}_i$ is the conventional SOCS approximation to the point spread function or kernel, within the diffraction limited ROI1.

We will describe the first term of the equation (4) as the diffraction limited part of the image or the SOCS image $I_{SOCS}(\vec{r})$:

$$I_{SOCS}(\vec{r}) \equiv \sum_{i=1}^{N} \left| \int_{ROI} d^2 \vec{r}_{Avg} \tilde{h}_i(\vec{r} - \vec{r}_{Avg}) m(\vec{r}_{Avg}) \right|^2. \quad (4A)$$

At a long distance, $j(\vec{\Delta}) \to \delta(\vec{\Delta})$, where $\delta(\vec{\Delta})$ is an impulse response function.

Substituting $\delta(\vec{\Delta})$ for $j(\vec{\Delta})$ in Equation (4), we get:

$$I(\vec{r}) \cong I_{SOCS}(\vec{r}) + \int\int_{\substack{outside \\ ROI1}} d^2 \vec{r}_{Avg} |h(\vec{r} - \vec{r}_{Avg})|^2 m(\vec{r}_{Avg}) m^*(\vec{r}_{Avg}) + \quad (5)$$

$$|h(\vec{r} - \vec{r}_{Avg})|^2 \int\int_{\substack{outside \\ ROI2}} d^2 \vec{r}_{Avg} m(\vec{r}_{Avg}) m^*(\vec{r}_{Avg})$$

Where ROI1 is the range of the diffraction limited optics determined by a rule of thumb given as ROI1 ~5λ/NA, where NA is the numerical aperture of the optical system and λ is the wavelength of light.

$I_{SOCS}(\vec{r})$ is the SOCS approximation from the first term of Equation 4 as described by Equation (4A.) above.

The other two terms of Equation (5) are due to the flare energy of the optical light.

The second term is referred to as the Intermediate Range Flare and is given by:

$$\int\int_{\substack{outside \\ ROI1}} d^2 \vec{r}_{Avg} |h(\vec{r} - \vec{r}_{Avg})|^2 m(\vec{r}_{Avg}) m^*(\vec{r}_{Avg}). \quad (5B)$$

The third term of Equation 5 is referred to as the Long Range Flare, and is given by:

$$|h(\vec{r} - \vec{r}_{Avg})|^2 \int\int_{\substack{outside \\ ROI2}} d^2 \vec{r}_{Avg} m(\vec{r}_{Avg}) m^*(\vec{r}_{Avg}). \quad (5C)$$

The boundary between the SOCS approximation and the Intermediate Range Flare is determined by ROI1 which is given as ~5λ/NA.

Figure 5:
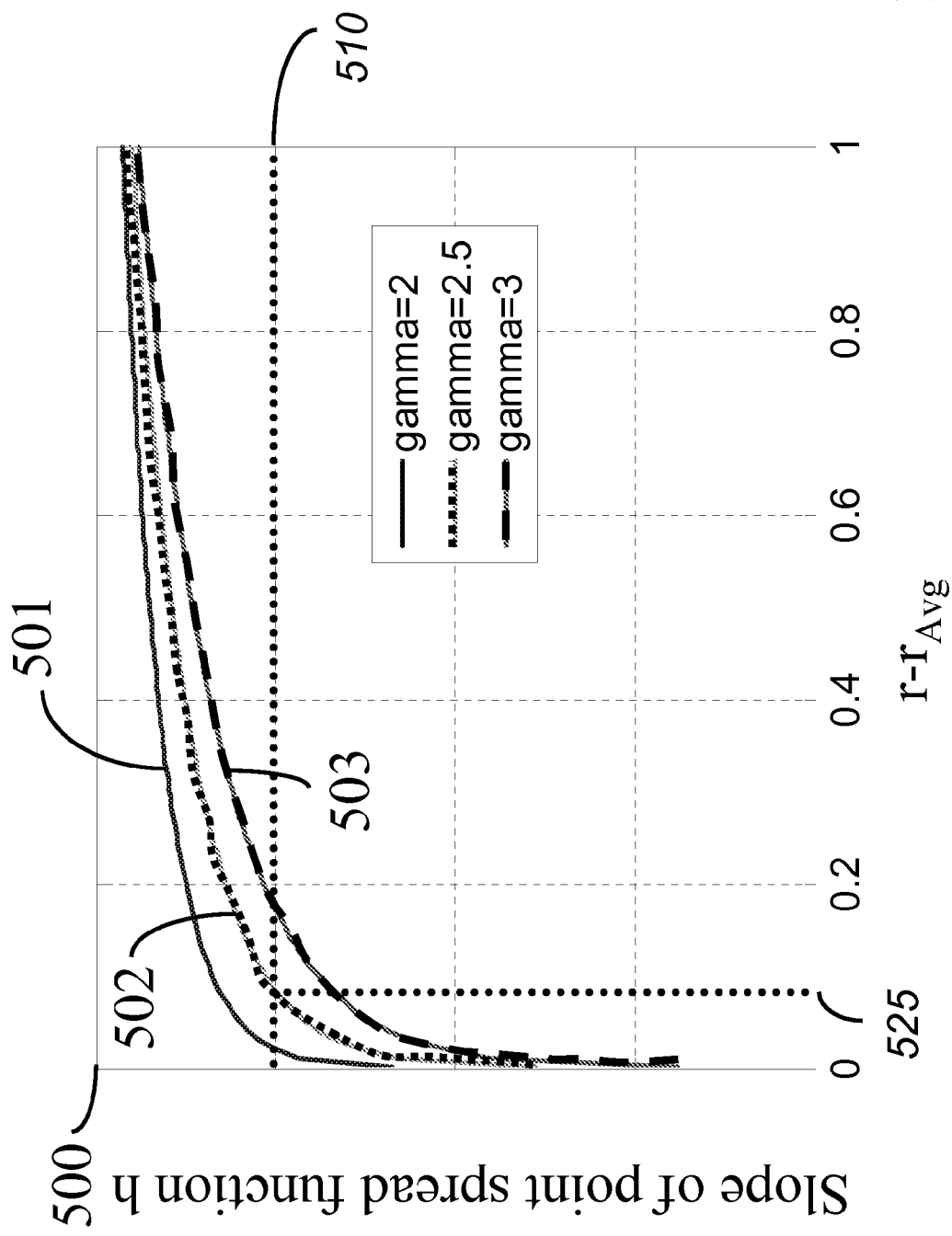
FIG. 5 illustrates a plot of the slope of the point spread function used for determining ROI2 in accordance with the invention.

Referring to FIG. 5, a preferred embodiment in accordance with the invention is described for determining the boundary ROI2 between the Intermediate Range Flare and the Long Range Flare. FIG. 5 illustrates plots of the slope (plotted in normalized units along the vertical axis, where a slope of zero is indicated by reference numeral 500) of the point spread function $h(\vec{r} - \vec{r}_{Avg})$ versus distance $\vec{r} - \vec{r}_{Avg}$ from the point of interest $\vec{r}$. The point spread function or kernel $h(\vec{r} - \vec{r}_{Avg})$ has the form $h \propto K/(\vec{r} - \vec{r}')^{\gamma}$, where K and γ are experimentally determined by measuring flare and fitting the power law function to the measured flare data. The slope of the point spread function is given by $$\frac{\partial h(\vec{r} - \vec{r}_{Avg})}{\partial \vec{r}},$$

and is plotted in FIG. 5 for various values of the flare kernel parameter γ. Typical values of γ current optical systems range between about 2 to 3. The curve 501 is the slope of $h(\vec{r} - \vec{r}_{Avg})$ for γ=2, the curve 502 is the slope of $h(\vec{r} - \vec{r}_{Avg})$ for γ=2.5, and the curve 503 is the slope $h(\vec{r} - \vec{r}_{Avg})$ for γ=3. Note that the slopes 501, 502, 503 all converge to zero slope 500 for large values of $\vec{r} - \vec{r}_{Avg}$, since the influence of flare diminishes with increasing distance from the point of interest. A slope cutoff criterion 510 may be chosen for a value of slope that sufficiently close to the value zero (500) such that the influence of flare beyond that distance is sufficiently small for the given mask layout and lithographic process. If the point spread function $h(\vec{r} - \vec{r}_{Avg})$ is determined experimentally to have γ=2.5, which a reasonable value for current lenses, then for given a slope cutoff value 510, the small flare radius of influence ROI2 (525) is the distance given by the intersection of the slope of the point spread function $h(\vec{r} - \vec{r}_{Avg})$ with the slope cutoff value 510.

In one embodiment in accordance with the present invention, multiple ROIs are defined around the evaluation point on an edge whose image intensity are to be evaluated, and the influencing neighboring shapes are smoothed to progressively remove details as the neighboring shape is located outside of a given ROI.

Thus, in accordance with one embodiment of the invention, the amount by which a neighboring shape is smoothed depends on its proximity to the point of interest on the main shape.

FIGS. 7A and 7B illustrate modifications of mask shapes used in flare computations in accordance with the invention. FIG. 7A illustrates one embodiment of smoothed shapes 701 of the mask 600 as in FIG. 6A with the original shapes 601 now shown in dashed lines. The point of interest 606 is the point at which the flare intensity is to be computed. The radius of small flare influence ROI2 is indicated by reference numeral 525.

Referring to FIG. 7A, according to one embodiment, shapes 701 are created by removing unnecessary variations of the shape 601 for all shapes within the radius of small flare influence ROI2 525 from the point of interest 606. This operation of removing unnecessary variations is referred to as smoothing.

For example, if the flare intensity is computed at point 606 using the geometric convolution method and using smoothed shapes 701 (instead of original shapes 601) it would result in a flare intensity value of 0.031513. This value has an error of 3.6% relative to the geometric convolution using the original unsmoothed shapes (see FIG. 6A and the related discussion above). However, the method using smoothed shapes in accordance with the invention only requires 16 convolution computations as compared to 48 convolutions using unsmoothed shapes. Note that this method achieves much better accuracy than the pixelized method with the same number of convolution computations.

The accuracy of this computation can be further increased with some computation cost, as in another embodiment illustrated in FIG. 7B. In the embodiment illustrated in FIG. 7B, a distance 521 of high flare influence ROI1 is identified, preferably about 5λ/NA, and all shapes 601 closest to the point 606 within ROI1 521 are not smoothed at all. However, the shapes within the intermediate distance range 535 between ROI1 521 and ROI2 525 (the distance of small flare influence), are smoothed to result in smoothed shapes 701 prior to computing the influence of flare effects. Using the shapes shown in FIG. 7B the flare intensity is computed at point 606 using the geometric method would result in a value of 0.032508. This value has an error of 0.56% relative to geometric convolution using the original unsmoothed shapes, while requiring 24 convolution computations (as compared to the 48 convolutions using the unsmoothed shapes).

In another embodiment in accordance with the present invention, the region of intermediate flare interaction ROI2 may be divided into several sub-ROIs, each having progressively decreasing flare influence as distance increases from the point of interest 606. The sub-ROIs may be defined as being contiguous or non-contiguous, and the embodiment is not intended to be a limiting example. The shapes within further sub-ROI's would have an increased amount of smoothing within the sub-ROI region relative to a sub-ROI region that is closer to the point of interest 606.

Figure 8A:
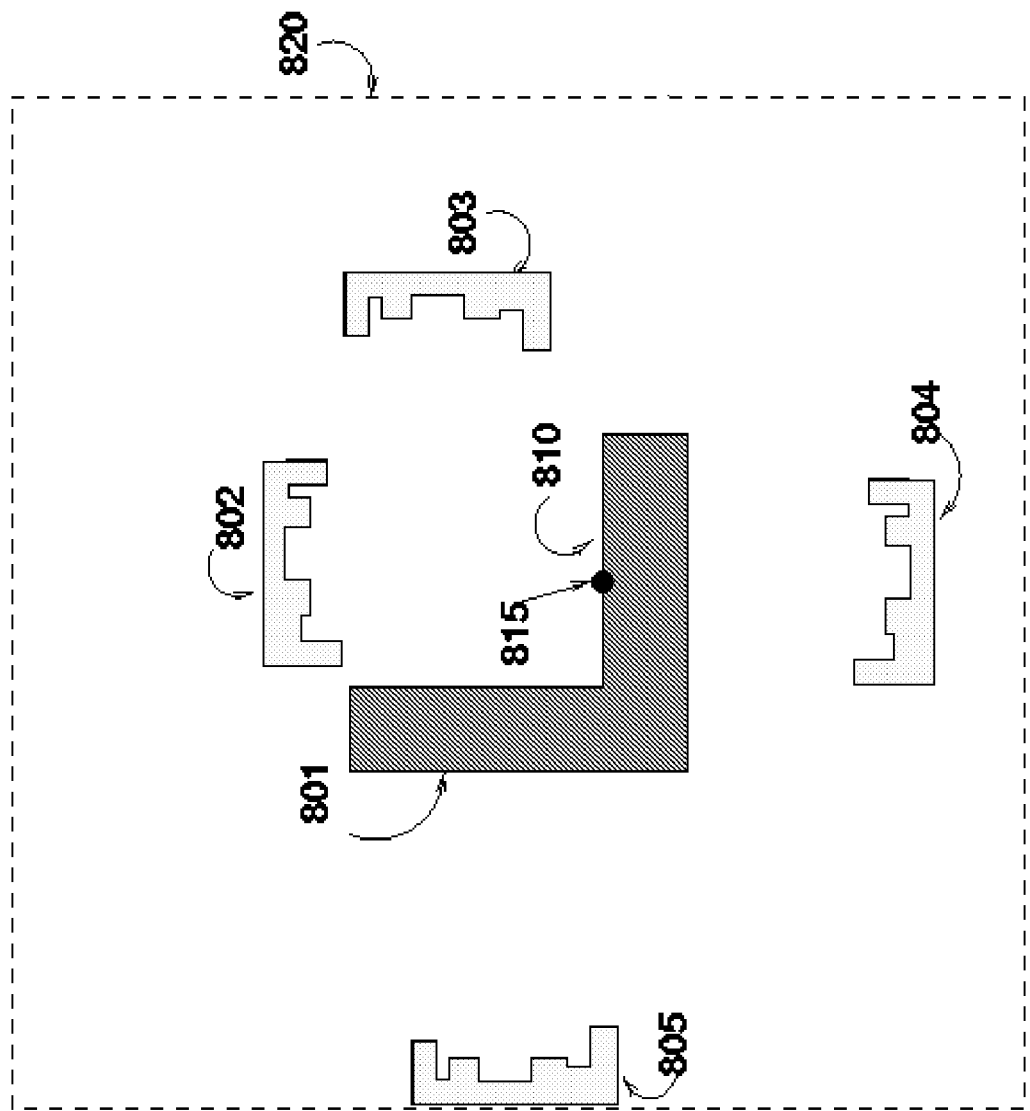
Figure 8B:
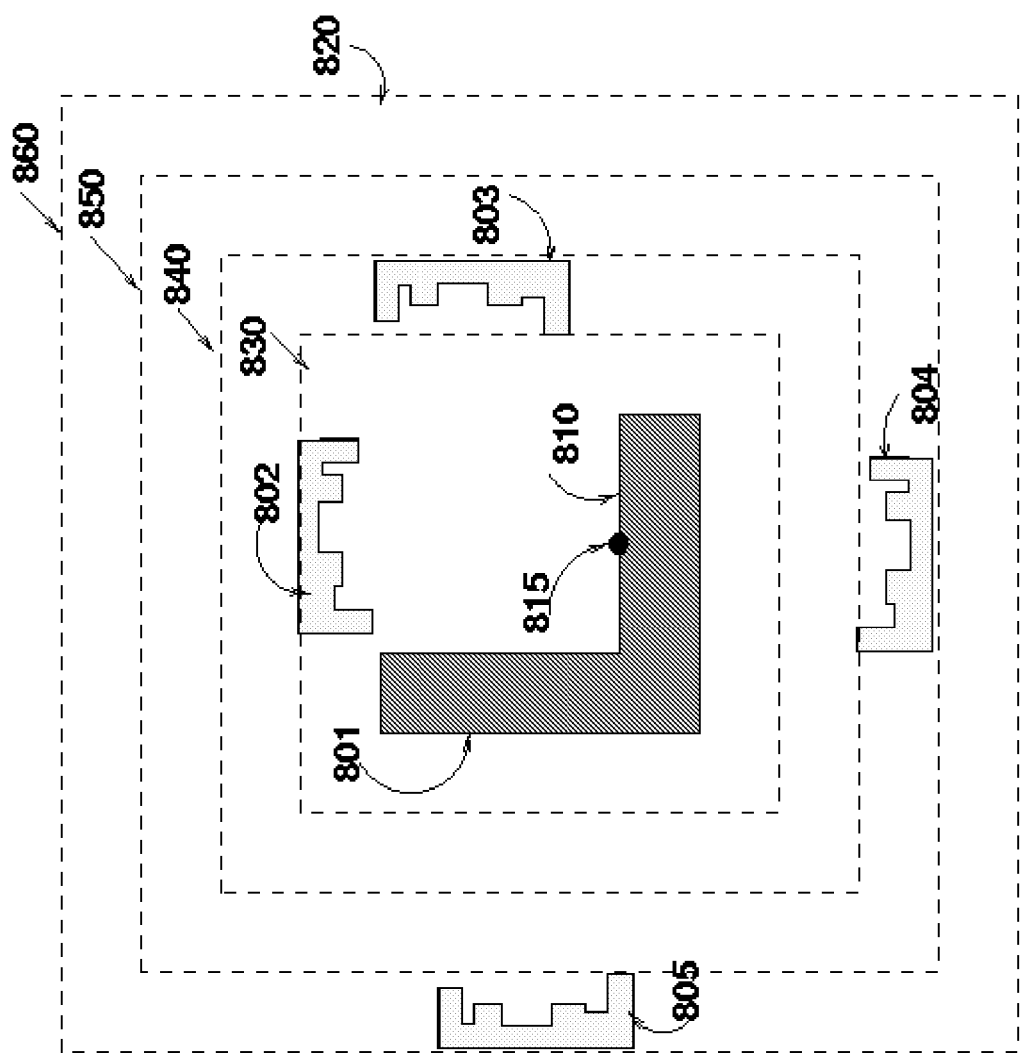
Figure 8C:
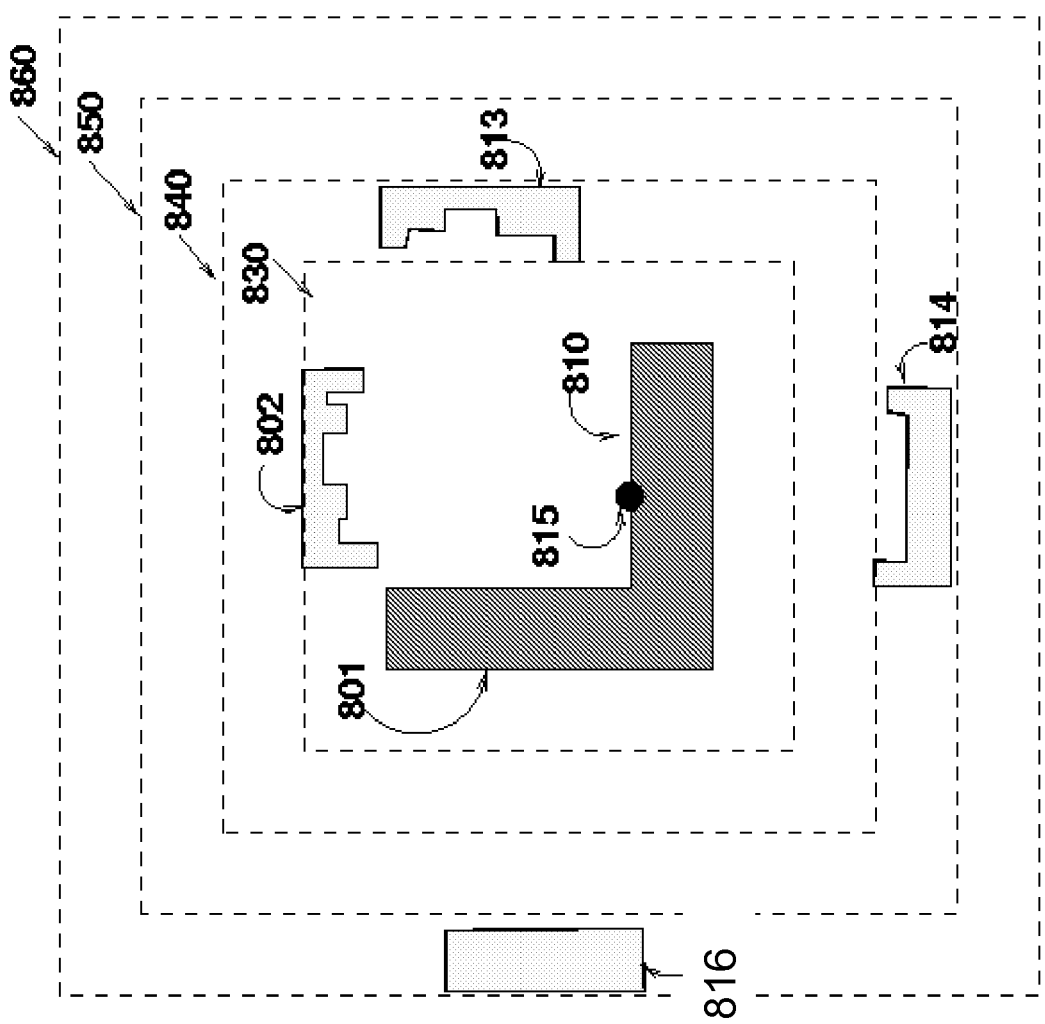

This is explained with the help of FIGS. 8A, 8B and 8C. FIG. 8A shows a mask shape 801 having a mask edge mask edge 810 and the corresponding evaluation point 815. The radius of low flare influence ROI2 corresponding to 815 is defined as the rectangular region 820. Note that those skilled in the art may also use other appropriate shapes of ROI2 such as a sphere or an ellipse or a other form of polygonal shapes or any Boolean combinations thereof. There are four shapes, viz., 802, 803, 804 and 805 within ROI2 820 that would influence the computation of the flare intensity at the point 815.

Now referring to FIG. 8B, the ROI2 820 is further divided into four regions 830, 840, 850 and 860. In this embodiment ROI2 820 is divided uniformly by distance. However, in another embodiment, region ROI2 820 can be divided uniformly based on the flare contribution energy. Further in another embodiment the ROI2 can be divided uniformly based on pattern density. The region 830 may be defined as a region of high flare influence ROI1. Shape 802 is within the high flare influence region ROI1 830. Shape 803 is within sub-ROI region 840, shape 804 is within sub-ROI region 850 and shape 805 is within sub-ROI region 860.

Now referring to FIG. 8C, shape 802 which is within ROI1 region 830 and closest to the point of interest 815 is the unsmoothed original shape 802 used in computing the flare intensity. Shape 803 which is within sub-ROI region 840 is smoothed to result in shape 813 before it is used computing the flare intensity. Shape 804 which is within sub-ROI region 850 which is further away from point of interest 815 is smoothed even more to result in smoothed shape 814 before it is used computing the flare intensity at point 815. Similarly, shape 805 which is within sub-ROI region 860, which is furthest away from point 815, is smoothed even more to result in smoothed shape 816 before it is used computing the flare intensity at point 815.

It is assumed in the current embodiment that all the variations are significant for the shapes that are closest to the main shape. However, in some designs, mask shapes may include sub-resolution features that are lithographically insignificant at any distance. These sub-resolution features may be pre-smoothed in the design before applying the model based OPC.

Smoothing may be performed by any suitable method, such as by sequential grow and shrink operations, for example, in a manner similar to Minkowski's Sum and Difference, described further below and discussed in co-assigned U.S. Pat. No. 7,261,981, the contents of which are incorporated herein by reference. Other suitable smoothing methods may be used, such as low-pass filtering in the spatial frequency domain, and may include any smoothing methods known presently to those skilled in the art or developed in the future.

A Minkowski's Sum of an object in the two-dimensional Euclidean domain is defined by rolling a ball of a given radius along the exterior boundary of the object and taking the point-set union of the original object and the area swept by the rolling ball. A Minkowski's Difference on an object in the two dimensional Euclidean domain is defined by rolling a ball of a given radius along the interior boundary of the object and taking the point-set difference of the area swept by the rolling ball from the original object. In this embodiment, since for manufacturing purposes, the mask shapes have edges that are in general substantially orthogonal in nature, smoothing is preferably performed using a sequential shrink and grow operations similar to Minkowski's Sum and Difference smoothing, where the shrink and grow smoothing operation is performed using an ortho smoothing object having edges parallel to the substantially orthogonal edges of the object.

Though the above embodiment of the invention has been demonstrated for small neighboring shapes, the inventive methodology can be applied to neighboring shapes that span several sub-regions or sub-ROIs of the intermediate range within the small flare influence distance ROI2. Referring to FIG. 8D, there is a mask shape 821 having a mask edge 822 with an evaluation point 825. The corresponding ROI2 is shown as 824. Another shape 823 is shown within the ROI2 824 that influences the computation of the flare intensity at point 825.

Figure 8E:
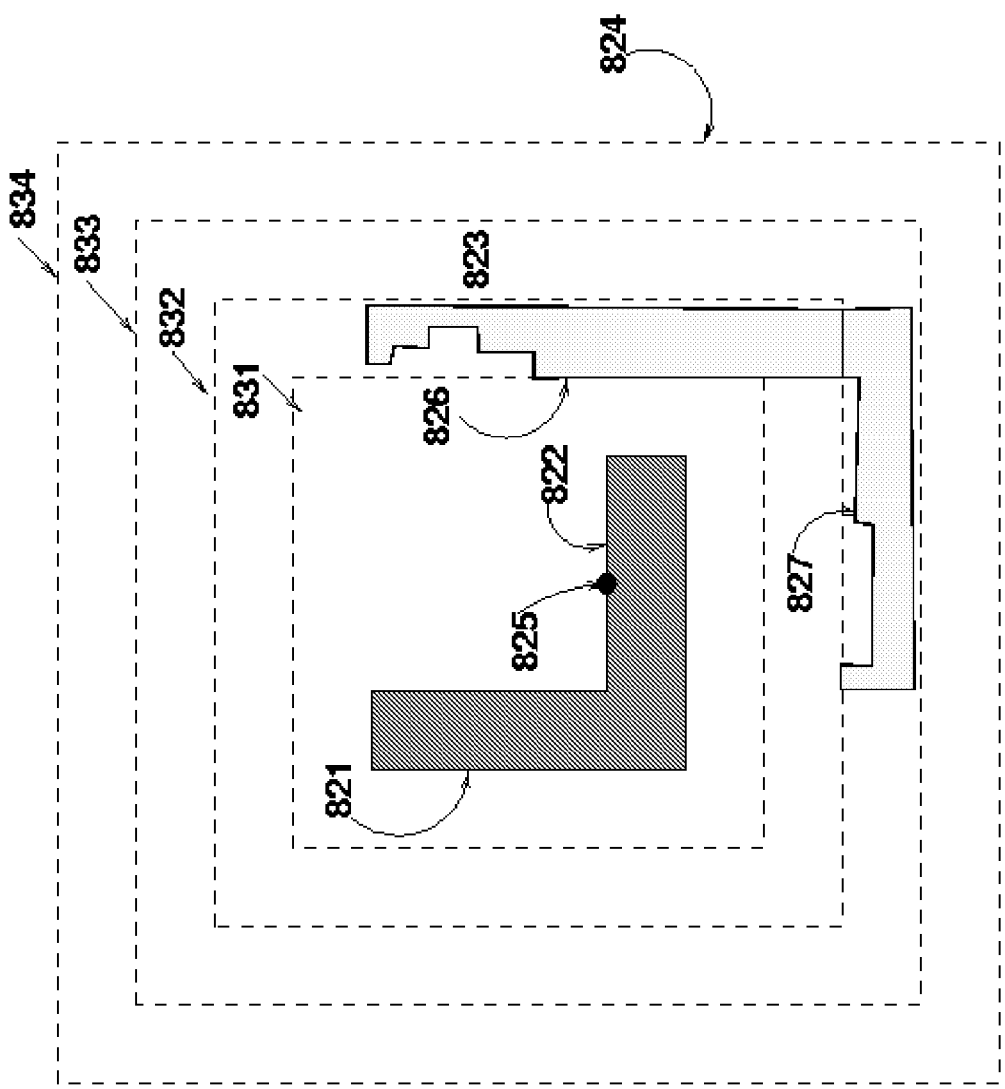

Now referring to FIG. 8E, the ROI2 824 is further divided into 4 sub-ROIs, viz., 831, 832, 833 and 834. Shape 823 spans two of these sub ROI-s, viz., sub-ROI's 832 and 833.

In an embodiment in accordance with the current invention, a first portion 826 of shape 823 that is within the sub-ROI region 832 is smoothed differently than the portion 827 of shape 823 that is within the sub-ROI region 833.

Figure 9:
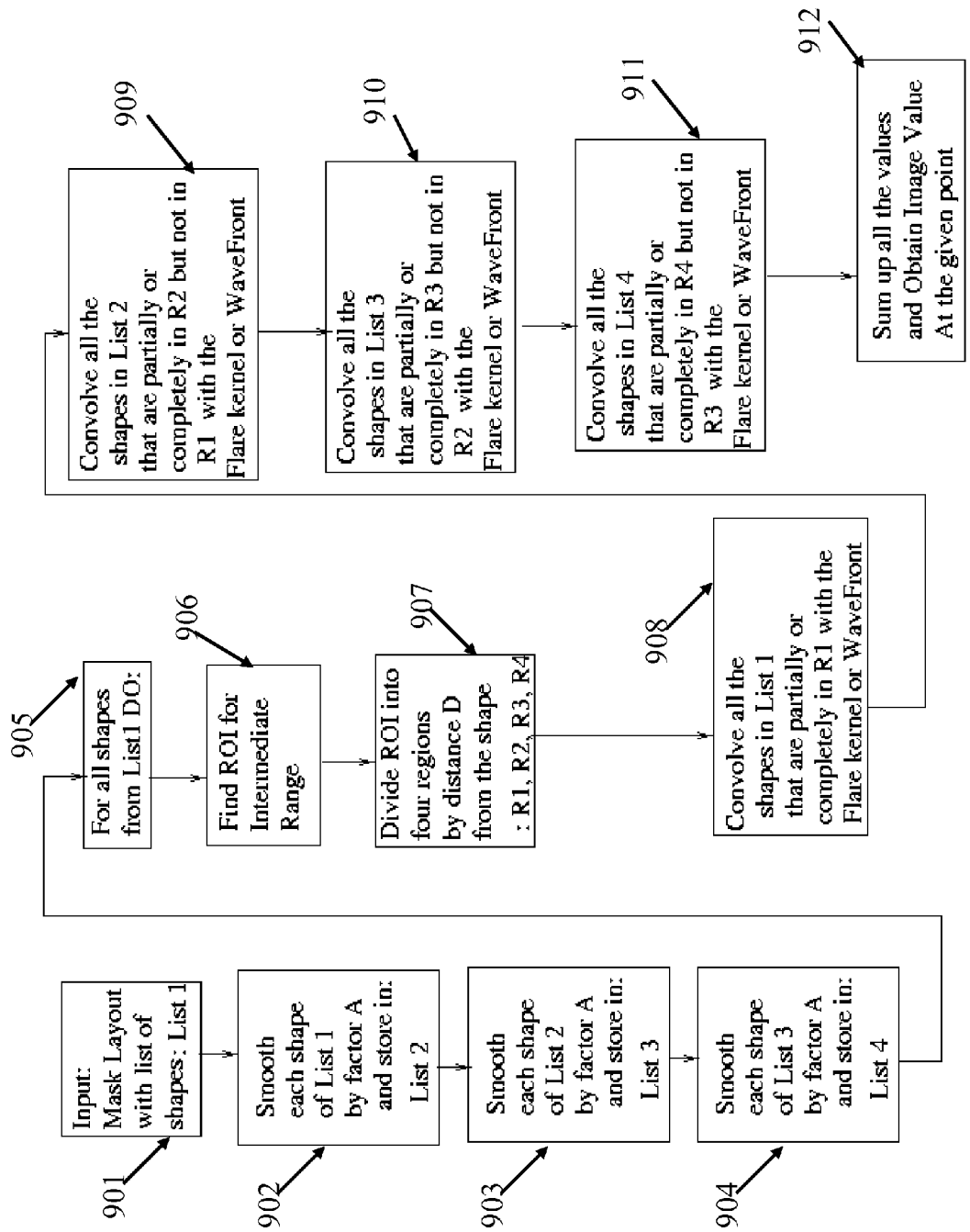
FIG. 9 illustrates an embodiment of a method for computing flare energy at a point of interest, in accordance with the invention.

FIG. 9 illustrates a flow diagram of a preferred embodiment of the present invention for computation of the flare intensity at a given point. First, a mask layout is provided, having a List 1 of M shapes (Block 901). Then an amount or degree of smoothing for each of the sub-ROI's to be considered, for example, a smoothing of degree n=1, . . . , N, is applied to each of these M shapes, where N is the total number of sub-ROI's around each shape. The nth degree of smoothing refers to any amount of smoothing that increases as n, or as the effective influence of features within a sub-ROI on optical processing of the shape of interest m decreases, for example as the distance of a neighboring shape from the evaluation point increases. The amount of increased smoothing of a neighboring shape as a function of distance from the evaluation point can be any appropriate amount, and need not be limited to a fixed factor or monotonic increase of smoothing. A preferred value for N is 4, but other values may be appropriate depending on the trade-offs between shape influence and computation time.

In Step 902, for all of shapes, m=1, ..., M in the List 1 they are smoothed by the given amount and put in another list List 2.

In Step 903, for all of shapes, m=1, ..., M in the List 2 they are smoothed again by the given amount and put in another list List 3.

In Step 904, for all of shapes, m=1, ..., M in the List 3 they are smoothed by the given amount and put in another list List 4.

For all of shapes, m=1, ..., M (Block 905 and 906), a main ROI around the evaluation point is obtained. The shapes are then (Block 907) divided into N sub-ROI's (Block 904), viz., R1, R2, R3 and R4.

In Step 908, all the shapes of List 1 that are partially or completely within R1, are convolved with the flare kernel to compute the flare energy within region R1.

In Step 909, all the shapes of List 2 that are partially or completely within R2, are convolved with the flare kernel to compute the flare energy within region R2.

In Step 910, all the shapes of List 3 that are partially or completely within R3, are convolved with the flare kernel to compute the flare energy within region R3.

In Step 911, all the shapes of List 4 that are partially or completely within R4, are convolved with the flare kernel to compute the flare energy within region R4.

In the final step 912, the flare energy as computed in steps 908, 909, 910 and 911 are summed up to output the total flare energy at the given point.

Figure 10:
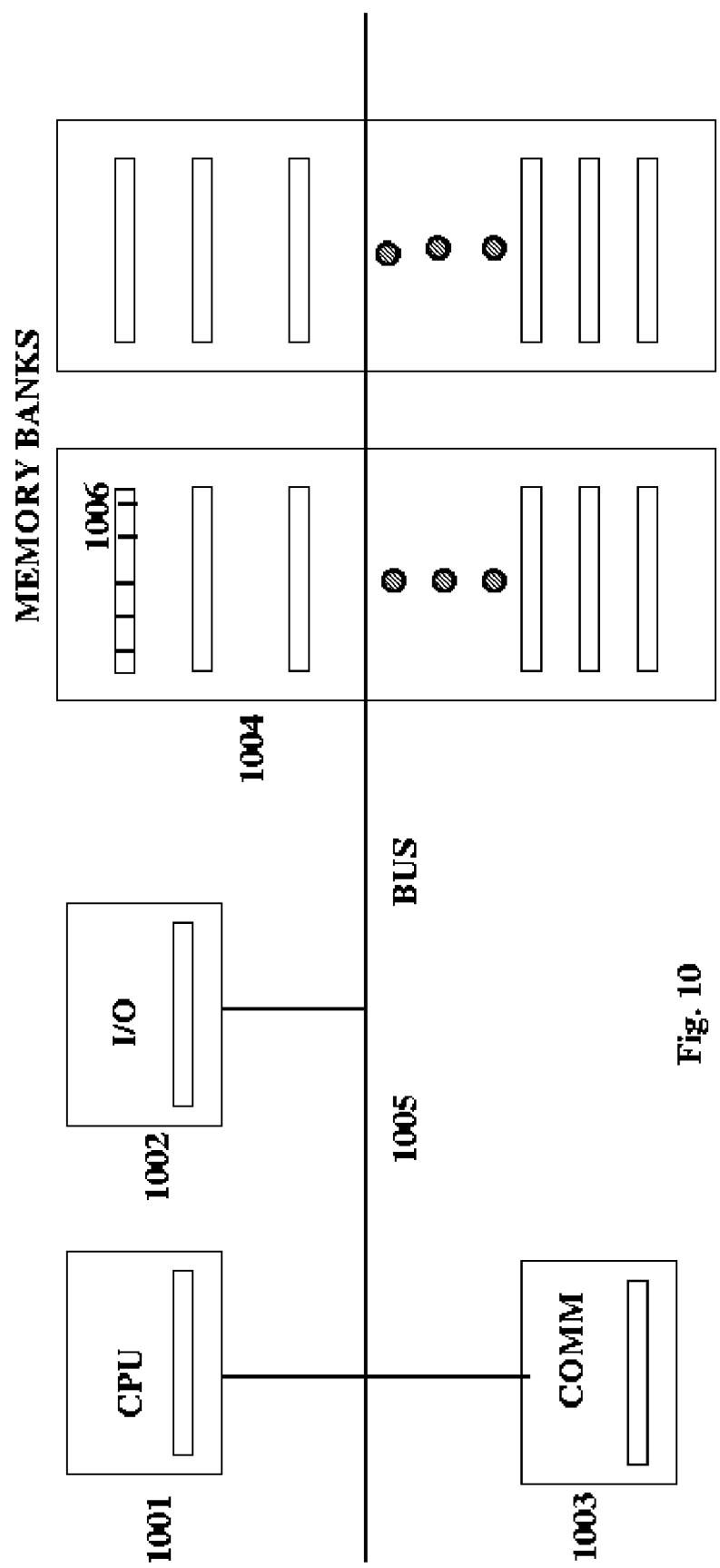
FIG. 10 illustrates an embodiment of a computer system and computer program product configured to perform a method for computing flare energy, in accordance with the invention.

Methods of obtaining effective bounds on process parameters as described above may be implemented in a machine, a computer, and/or a computing system or equipment. FIG. 10 is a simplified diagram illustration of a computing system 1000 according to one embodiment of the present invention. Computing system or computer system 1000 may include, inter alia, a central processing unit (CPU) 1001 for data processing, at least one input/output (I/O) device 1002 (such as a keyboard, a mouse, a compact disk (CD) drive, a display device, or a combination thereof or the like) for accepting instructions and/or input from an operator or user and outputting results from CPU processing data during simulation or computation, a controller 1003 capable of controlling the operation of computing system 1000, a storage device or medium 1004 capable of reading and/or writing computer readable code, and a memory device or medium 1005—all of which are operationally connected, e.g., by a bus or a wired or wireless communications network (1006). Embodiments of the present invention may be implemented as a computer program product stored on a computer readable medium such as storage device 1004, or memory device 1005, a tape or a compact disk (CD). The computer program product may contain instructions which may implement the method according to embodiments of the present invention on the computer system 1000. Finally, the present invention can also be implemented in a plurality of distributed computers where the present items may reside in close physical proximity or distributed over a large geographic region and connected by a communications network.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

The invention claimed is:

1. A method of designing a lithographic mask including the use of a lithographic process model for simulating an image formed by illumination of the lithographic mask in a lithographic system, the method comprising:

determining a first region of influence (ROI1) around a point of interest on a mask design, such that mask features within said first ROI1 will contribute a relatively large amount of flare energy at said point of interest;

determining a second region of influence (ROI2) around said point of interest, such that mask features outside of said ROI2 will contributed a relatively small amount of flare energy at said point of interest in accordance with a predetermined criterion, such that the region between ROI1 and ROI2 comprises an intermediate region of influence (intermediate ROI);

identifying an initial mask polygon shape having a first plurality of vertices located within the intermediate ROI;

smoothing said initial mask polygon shape to form a smoothed mask polygon shape that has fewer vertices within the intermediate ROI than said first plurality of vertices;

determining, by using a computer, a smoothed flare contribution at said point of interest from said vertices of said smoothed mask polygon within the intermediate ROI; and determining an image at the point of interest comprising using said smoothed flare contribution in the lithographic process model rather than a flare contribution from said initial mask polygon shape;

wherein said predetermined criterion comprises a slope cutoff for determining when a slope of a point spread function of the lithographic system is close to zero.

2. The method according to claim 1, wherein said ROI1 has an outer boundary at a distance of about $5\lambda/NA$ around the point of interest, where $\lambda$ is the wavelength of the illumination energy and NA is the numerical aperture of the lithographic system.

3. The method according to claim 1, wherein the point spread function (h) $[h(\vec{r}-\vec{r}_{Avg})]$ is a function of distance $[(\vec{r}-\vec{r}_{Avg})]$ from a point of interest $(\vec{r})$, and the point spread function has the form $h \propto K/(\vec{r}-\vec{r}\,')^{\gamma}$, where K is a constant, $\vec{r}$ is a point of interest, $\vec{r}\,'$ first dummy distance variable in the optical coordinate system from the point of interest $\vec{r}$, and $\gamma$ is the flare kernel parameter and is experimentally determined, and wherein the slope of the point spread function is given by $$\frac{\partial h(\vec{r}-\vec{r}_{Avg})}{\partial \vec{r}},$$

where $$\vec{r}_{Avg} = \frac{\vec{r}\,' + \vec{r}\,''}{2},$$

and $\vec{r}\,''$ is a second dummy distance variable in the optical coordinate system from the point of interest $\vec{r}$.

4. The method according to claim 1, wherein said intermediate ROI is further divided into a plurality of sub-intermediate ROIs, and wherein a different amount of smoothing is performed in at least one of said plurality of sub-intermediate ROIs than in another of said plurality of sub-intermediate ROIs.

5. The method according to claim 4, wherein the amount of smoothing in a sub-intermediate ROI depends on the proximity of said sub-intermediate ROI to said point of interest.

6. The method according to claim 1, wherein said smoothing is performed by a sequential grow and shrink operation or a low-pass filtering in a spatial frequency domain.

7. The method according to claim 1, wherein in said step of determining an image at the point of interest comprises determining a flare contribution from within said first ROI1 using mask features within said first ROI1 that are not smoothed.

8. The method according to claim 1, wherein in said step of determining an image at the point of interest comprises determining a flare contribution from mask features located beyond said second ROI2 using a density mapping approach.

9. The method according to claim 1, wherein said image is provided for use in an optical proximity correction methodology or in a mask verification methodology.

10. A computer program product comprising a computer readable storage device having a computer readable program embodied in said medium, for designing a lithographic mask, including a lithographic process model for simulating an image formed by illumination of the lithographic mask in a lithographic system wherein the computer readable program when executed on a computer causes the computer to perform the steps of:
- determining a first region of influence (ROI1) around a point of interest on the mask design, such that mask features within said first ROI1 will contribute a relatively large amount of flare energy at said point of interest;
- determining a second region of influence (ROI2) around said point of interest, such that mask features outside of said ROI2 will contributed a relatively small amount of flare energy at said point of interest in accordance with a predetermined criterion, such that the region between ROI1 and ROI2 comprises an intermediate region of influence (intermediate ROI);
- identifying an initial mask polygon shape having a first plurality of vertices located within the intermediate ROI; and
- smoothing said initial mask polygon shape to form a smoothed mask polygon shape that has fewer vertices within the intermediate ROI than said first plurality of vertices;
- determining a smoothed flare contribution at said point of interest from said vertices of said smoothed mask polygon within the intermediate ROI;
- determining an image at the point of interest comprising using said smoothed flare contribution in the lithographic process model rather than a flare contribution from said initial mask polygon shape; and
- wherein said predetermined criterion comprises a slope cutoff for determining when a slope of a point spread function of the lithographic system is close to zero.

11. The computer program product according to claim 10, wherein said ROI1 has an outer boundary at a distance of about 5λ/NA around the point of interest, where λ is the wavelength of the illumination energy and NA is the numerical aperture of the lithographic system.

12. The computer program product according to claim 10, wherein the point spread function $(h)[h(\vec{r}-\vec{r}_{Avg})]$ is a function of distance $[\vec{r}-\vec{r}_{Avg}]$ from a point of interest $(\vec{r})$, and the point spread function has the form $h \propto K/(\vec{r}-\vec{r}')^\gamma$, where K is a constant, $\vec{r}$ is a point of interest, $\vec{r}'$ is a first dummy distance variable in the optical coordinate system from the point of interest $\vec{r}$, and γ is the flare kernel parameter and is experimentally determined, and wherein the slope of the point spread function is given by $$\frac{\partial h(\vec{r}-\vec{r}_{Avg})}{\partial \vec{r}},$$

where $$\vec{r}_{Avg} = \frac{\vec{r}'+\vec{r}''}{2},$$

and where $\vec{r}''$ is a second dummy distance variable in the optical coordinate system from the point of interest $\vec{r}$.

13. The computer program product according to claim 10, wherein said intermediate ROI is further divided into a plurality of sub-intermediate ROIs, and wherein a different amount of smoothing is performed in at least one of said plurality of sub-intermediate ROIs than in another of said plurality of sub-intermediate ROIs.

14. The computer program product according to claim 13, wherein the amount of smoothing in a sub-intermediate ROI depends on the proximity of said sub-intermediate ROI to said point of interest.

15. The computer program product according to claim 10, wherein said smoothing is performed by a sequential grow and shrink operation or a low-pass filtering in a spatial frequency domain.

16. The computer program product according to claim 10, wherein in said step of determining an image at the point of interest comprises determining a flare contribution from within said first ROI1 using mask features within said first ROI1 that are not smoothed.

17. The computer program product according to claim 10, wherein in said step of determining an image at the point of interest comprises determining a flare contribution from mask features located beyond said second ROI2 using a density mapping approach.

18. The computer program product according to claim 10, wherein said image is provided for use in an optical proximity correction methodology or in a mask verification methodology.

* * * * *